United States Patent [19]
Yamazaki et al.

[11] Patent Number: 6,140,667
[45] Date of Patent: Oct. 31, 2000

[54] SEMICONDUCTOR THIN FILM IN SEMICONDUCTOR DEVICE HAVING GRAIN BOUNDARIES

[75] Inventors: Shunpei Yamazaki, Tokyo; Hisashi Ohtani, Kanagawa, both of Japan

[73] Assignee: Semiconductor Energy Laboratory Co., Ltd., Kanagawa-ken

[21] Appl. No.: 09/027,344

[22] Filed: Feb. 20, 1998

[30] Foreign Application Priority Data

Feb. 24, 1997 [JP] Japan ................................. 9-055633
Feb. 9, 1998 [JP] Japan ................................. 10-044659

[51] Int. Cl.$^7$ .................................................. H01L 21/20
[52] U.S. Cl. .............................. 257/59; 257/49; 257/50; 257/51; 257/52; 257/57; 257/62; 257/64; 257/65; 257/66; 257/69; 257/70
[58] Field of Search ................................. 257/49–69, 70

[56] References Cited

U.S. PATENT DOCUMENTS

| | | | |
|---|---|---|---|
| 5,529,937 | 6/1996 | Zhang et al. ........................... | 437/10 |
| 5,608,232 | 3/1997 | Yamazaki et al. ..................... | 257/66 |
| 5,639,698 | 6/1997 | Yamazaki et al. ..................... | 437/228 |
| 5,814,540 | 9/1998 | Takemura et al. ..................... | 438/166 |
| 5,843,833 | 12/1998 | Ohtani et al. ......................... | 438/486 |
| 5,869,363 | 2/1999 | Yamazaki et al. ..................... | 438/166 |
| 5,888,858 | 3/1999 | Yamazaki et al. ..................... | 438/162 |
| 5,897,374 | 4/1999 | Yung-Fa Lin ......................... | 438/666 |

*Primary Examiner*—Fetsum Abraham
*Attorney, Agent, or Firm*—Fish & Richardson P.C.

[57] ABSTRACT

To provide a semiconductor device having a function equivalent to that of IGFET, an activation layer is formed by a crystal silicon film crystallized by using a catalyst element helping promote crystallization and a heating treatment is carried out in an atmosphere including a halogen element by which the catalyst element is removed, the activation layer processed by such steps is constituted by a peculiar crystal structure and according to the crystal structure, a rate of incommensurate bonds in respect of all of bonds at grain boundaries is 5% or less (preferably, 3% or less).

16 Claims, 15 Drawing Sheets

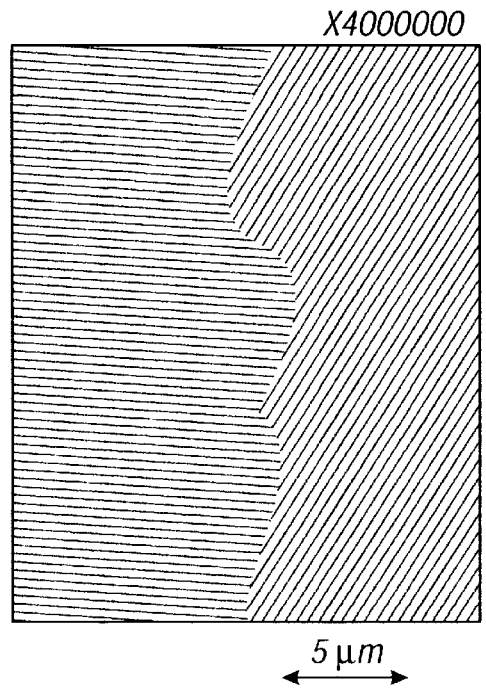
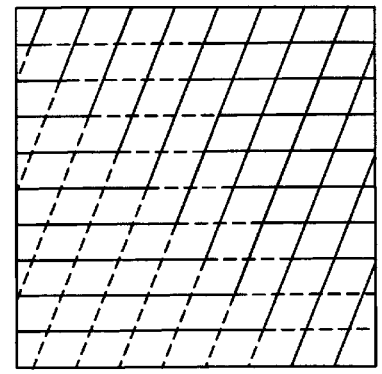
FIG. 10A
FIG. 10B
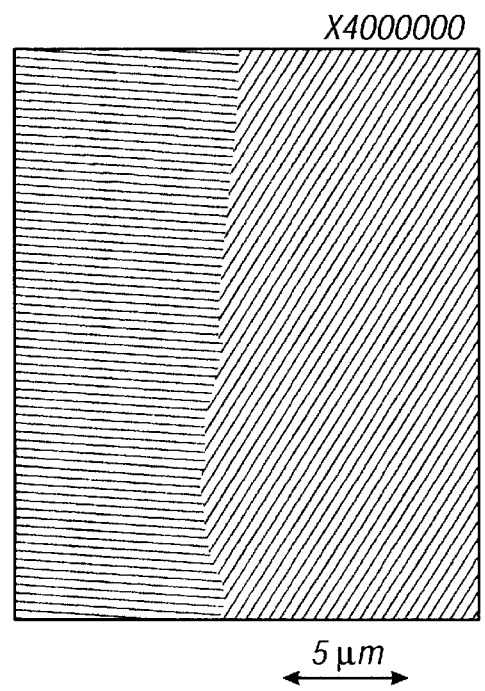
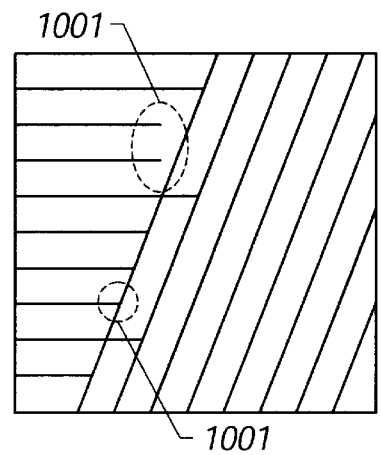
FIG. 10C
FIG. 10D

6,140,667

SEMICONDUCTOR THIN FILM IN SEMICONDUCTOR DEVICE HAVING GRAIN BOUNDARIES

BACKGROUND OF THE INVENTION

1. Field of the Invention:

The present invention disclosed in the specification relates to a semiconductor thin film which is formed on a substrate having an insulating surface and a semiconductor device having the semiconductor thin film as an activation layer. Particularly, the present invention relates to a constitution in the case where a crystal silicon film (crystalline silicon film) is used as a semiconductor thin film.

Incidentally, "semiconductor device" in the specification designates all of devices which function by utilizing a semiconductor and the followings are included in the category of a semiconductor device.

(1) Single element of TFT (Thin Film Transistor) IGFET (Insulated Gate Field Effect Transistor) or the like:
(2) Semiconductor circuit using the single element of (1):
(3) Electrooptical device constituted by (1), (2):
(4) Electronic device having (2), (3).

2. Description of Related Art:

In recent years, a technology of constituting a thin film transistor (TFT) by using a semiconductor thin film (thickness; about several hundreds through several thousands Å) formed on a substrate having an insulating surface has attracted attention. A thin film transistor is widely applied to electronic devices such as IC (Integrated Circuit) or an electrooptical device and particularly, development thereof has been accelerated as a switching element of an image display device.

For example, trials have been carried out in respect of applying TFT to all the electric circuits of a pixel matrix circuit for individually controlling pixel regions arranged in a matrix in a liquid crystal display device, a drive circuit for controlling the pixel matrix circuit, a logic circuit (processor circuit or memory circuit or the like) for processing data signal from outside and the like.

In the current state, TFT using an amorphous silicon film as an activation layer has been reduced into practice. However, in an electric circuit where high speed operational function is requested such as a drive circuit, a logic circuit or the like, TFT using a crystal silicon film (polysilicon film, polycrystal silicon film or the like) is needed.

For example, as a method of forming a crystalline silicon film on a glass substrate, a technology disclosed in Japanese Unexamined Patent Publication No. JP-A-7-130652 and a technology disclosed in Japanese Unexamined Patent Publication No. JP-A-8-78329 by the applicant have publicly been known. According to the technologies disclosed in these publications, a crystal silicon film having excellent crystalline performance can be formed by a heating treatment at 500 through 600° C. for about 4 hrs by utilizing a catalyst element helping crystalize an amorphous silicon film.

Particularly, according to the technology disclosed in Japanese Unexamined Patent Publication No. JP-A-8-78329, crystal growth substantially parallel with a substrate face is carried out by applying the above-described technology and the inventors refer the formed crystallized region particularly as a horizontal growth region (or lateral growth region).

However, even when a drive circuit is constituted by using such a TFT, the required function cannot completely be satisfied yet. It is the current state that a high speed logic circuit requiring an extremely high speed operation of mega bit through giga bit level cannot be constituted by conventional TFT.

SUMMARY OF THE INVENTION

It is a problem of the present invention to provide a semiconductor device having extremely high function capable of constituting a high speed logic circuit which could not be fabricated by conventional TFT. Further, it is a problem of the present invention to provide a semiconductor thin film for realizing such a semiconductor device.

A semiconductor thin film provided by the present invention is featured in that the semiconductor thin film is provided with at least two crystals and grain boundaries among the crystals and a rate of incommensurate bonds to all of bonds at the grain boundaries is 5% or lower (preferably, 3% or lower).

As another constitution, the semiconductor thin film according to the present invention is featured in that the semiconductor thin film is provided with at least two crystals and grain boundaries among crystals and a number of incommensurate bonds included in 100 of bonds is 5 or smaller (preferably, 3 or smaller) at least in one arbitrary region of the crystal boundaries.

As another constitution, the semiconductor thin film provided by the present invention is featured in that the semiconductor thin film is provided with at least two crystals and grain boundaries among crystals and a number of incommensurate bonds included in 50 of bonds is 0 at least in one arbitrary region of the crystal boundaries.

As another constitution, the semiconductor thin film of the present invention is featured in that the semiconductor thin film is provided with at least two crystals and grain boundaries among crystals and an angle made by a lattice striation observed in an arbitrary one of the at least two crystals and a lattice striation observed in a contiguous other one of the two crystals falls in a range of 60 through 80°.

The present invention constitutes an activation layer of a semiconductor device represented by TFT by using a semiconductor film constituted as described above and a semiconductor device having high function sufficient for constituting a drive circuit or a logic circuit is realized.

A detailed explanation will be given of the constitution of the present invention described above by embodiments described in the following.

BRIEF DESCRIPTION OF THE DRAWINGS

FIGS. 7A through 7E are views for explaining examples of electronic devices;

FIGS. 10A through 10D are HR-TEM photographs showing lattice striations of grain boundary;

DETAILED DESCRIPTION OF THE PREFERRED EMBODIMENTS (Embodiment 1)

In this embodiment, an example of forming TFTs according to the present invention on a substrate having an insulating surface and monolithically constituting a pixel matrix circuit and a CMOS (Complementary Metal Oxide Semiconductor) circuit will be shown. Further, according to the embodiment, an example of a CMOS circuit as a basic circuit for constituting a driver circuit or a logic circuit will be shown.

First, a quartz substrate 101 is prepared as a substrate having an insulating surface. A ceramic substrate, a silicon substrate or the like having an insulating film of a thickness of 0.5 through 5 $\mu$m formed on the surface can be used in place of the quartz substrate. Incidentally, a low grade silicon substrate such as used in a solar cell is inexpensive and therefore, the substrate is effective in a use where a light transmitting substrate needs not to use as in a reflecting type display device.

Notation 102 designates an amorphous silicon film in which a final film thickness (film thickness in consideration of a reduction in film thickness after thermal oxidation) is adjusted to 10 through 75 nm (preferably, 15 through 45 nm). It is preferable to form the film by the low pressure thermal CVD (Chemical Vapor Deposition) process or the plasma CVD process.

Next, a step of crystallizing amorphous silicon film 102 is carried out. Although the technologies disclosed in Japanese Unexamined Patent Publication No. JP-A-7-130652 and Japanese Unexamined Patent Publication No. JP-A-8-78329 can be used as crystallizing means, in this embodiment, an explanation will be given of the case where the latter technology is used.

According to the technology disclosed in the publication, firstly, a mask insulating film 103 selecting regions of adding a catalyst element is formed. The mask insulating film 103 is provided with a plurality of locations of openings for adding a catalyst element. The position of crystallizing region can be determined by the positions of the contact holes.

Figure 1A:
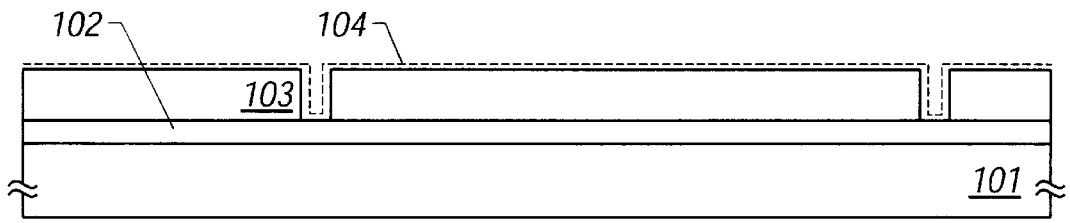
FIGS. 1A through 1E are views showing fabrication steps of an active matrix substrate.

Further, a solution including nickel (Ni) as a catalyst element for helping crystalize the amorphous silicon film is coated by a spin coating process by which an Ni including layer 104 is formed. Incidentally, as a catalyst element, other than nickel, cobalt (Co), iron (Fe), tin (Sn), lead (Pb), palladium (Pd), platinum (Pt), copper (Cu), gold (Au), or the like can be used. (FIG. 1A)

Further, for the step of adding a catalyst element, the ion implantation process or the plasma doping process using a resist mask can also be used. In this case, the technology is effective in constituting a miniaturized circuit since reduction in an occupied area of the adding region and the control of a growth distance in the horizontal growth region are facilitated.

Next, when the step of adding a catalyst element has been finished, the amorphous silicon film 102 is crystallized by carrying out a heating treatment at temperatures of 500 through 700° C., representatively, 550 through 650° C. for 4 through 12 hr in an inert atmosphere or an atmosphere including hydrogen or oxygen.

Figure 1B:
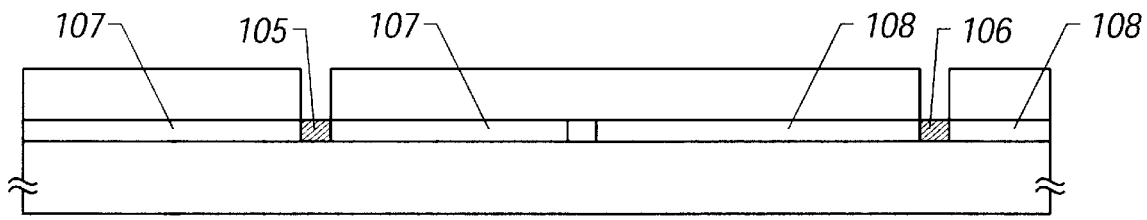

In this case, the crystallization of the amorphous silicon film 102 is progressed with priority from regions 105 and 106 added with nickel and horizontal growth regions 107 and 108 which have grown substantially in parallel with the substrate face of the substrate 101 are formed. According to the invention, only the horizontal growth regions 107 and 108 are used as activation layers. (FIG. 1B)

When the heating treatment for crystallization has been finished, the mask insulating film 103 is removed, patterning is carried out and island-like semiconductor layers (activation layers) 109 through 111 comprising only the horizontal growth regions are formed. Here, numeral 109 designates an activation layer of an N-channel type TFT constituting a CMOS circuit, numeral 110 designates an activation layer of a P-channel type TFT constituting the CMOS circuit and numeral 111 designates an activation layer of an N-channel TFT constituting a pixel matrix circuit.

When the activation layers 109 through III constituted by crystal silicon films comprising the horizontal growth regions have been formed, a gate insulating film 112 comprising an insulating film including silicon is formed. The film thickness of the gate insulating film 112 may be adjusted in a range of 20 through 250 nm in consideration of an increase in the film thickness by a later thermally oxidizing step. Further, a publicly-known gas phase process may be used as the film forming method.

Figure 1C:
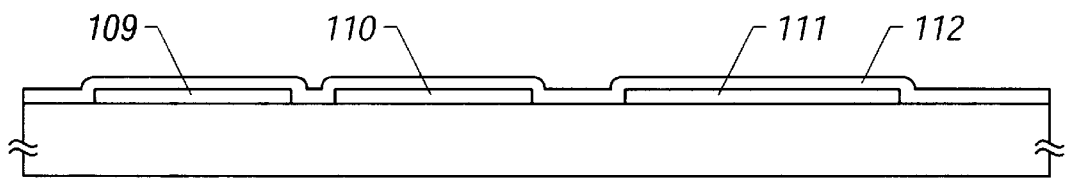

Next, as shown by FIG. 1C, a heating treatment for removing the catalyst element (nickel) by gettering (gettering process of catalyst element) is carried out. The heating treatment is for utilizing the gettering effect of metal element by halogen element. Further, in order to efficiently achieve the gettering effect by halogen element, the heating treatment is preferably carried out at temperatures exceeding 700° C. Therefore, according to the embodiment, the heating treatment is carried out at temperatures exceeding 700° C., preferably, 800 through 1000° C. (representatively, 950° C.) and the processing time is set to 0.1 through 6 hr, representatively, 0.5 through 1 hr.

Further, in this case, an example of carrying out a heating treatment at 950° C. for 30 minutes in an atmosphere in which hydrogen chloride (HCl) is included by a concentration of 0.5 through 10 volume % (3 volume % in this embodiment) will be shown. When the concentration of HCl is set to be equal to or higher than the above-described concentration, irregularities of a size of substantially the film thickness are caused on the surface of the activation layers 109 through 111 which is not preferable.

Also, the rate of oxidation of the crystal silicon film can be lowered by constituting an atmosphere formed by mixing high concentration nitrogen ($N_2$) in the above-described oxidizing atmosphere. This is means which is effective in the case where the gettering time is increased without progressing the thermal oxidation reaction more than necessary.

Further, although an example of using HCl gas has been shown as a compound including a halogen element, as gasses other than HCl gas, a single or a plurality of gasses selected from compounds including halogen of representatively, HF, $NF_3$, HBr, $Cl_2$, $ClF_3$, $BCl_3$, $F_2$, $Br_2$ and the like may be used.

In this step, it seems that nickel in the activation layers 109 through 111 is gettered by the operation of chlorine and volatile nickel chloride is formed and is removed by being separated into the atmosphere. Further, the concentration of nickel in the activation layers 109 through 111 is reduced down to $1\times10^{17}$ atoms/cm³ or lower (preferably, spin density or lower) by this step. Incidentally, the impurity concentration according to the specification is defined by a minimum value of measured values obtained by SIMS (Secondary Ion Mass Spectroscopy) analysis.

Further, the thermal oxidation reaction is progressed at interfaces between the activation layers 109 through 111 and the gate insulating film 112 by the above-described heating treatment and the total film thickness of the gate insulating film 112 is increased by a portion of the formed thermally oxidized film (not illustrated). Therefore, the activation layers 109 through 111 are thinned in inverse proportion to the portion of forming the thermally oxide film. The thinning of the activation layers expedites effects of reduction in OFF current of TFT, promotion of field effect mobility and the like.

Further, according to the activation layers 109 through 111 formed by dry etching process, normally, plasma damage remains at edges, however, according to the present invention, the edges are also thermally oxidized and therefore, such a damage is also removed.

Further, by carrying out a heating treatment at 950° C. for about 1 hr in a nitrogen atmosphere after performing the above-described heating treatment in a halogen atmosphere, not only the film quality of the gate insulating film 112 is promoted but an extremely excellent semiconductor/insulating film interface is realized.

Further, it has been confirmed that halogen element used in the gettering processing remains in the activation layers 109 through 111 at a concentration of $1\times10^{15}$ atoms/cm³ through $1\times10^{20}$ atoms/cm³ by SIMS analysis. Further, in this case, it has been confirmed by SIMS analysis that high concentration of halogen element is distributed between the activation layers 109 through 111 and the thermally oxidized film formed by the heating treatment.

Figure 1D:
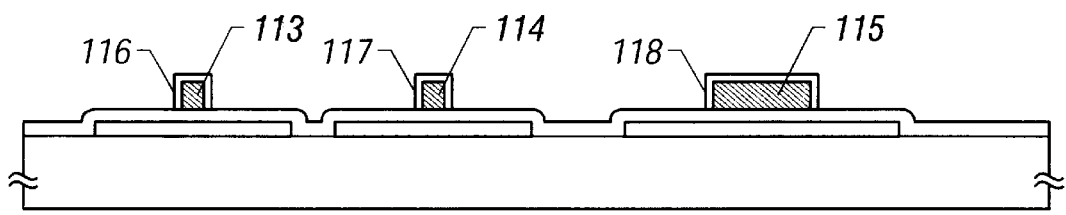
Figure 1E:
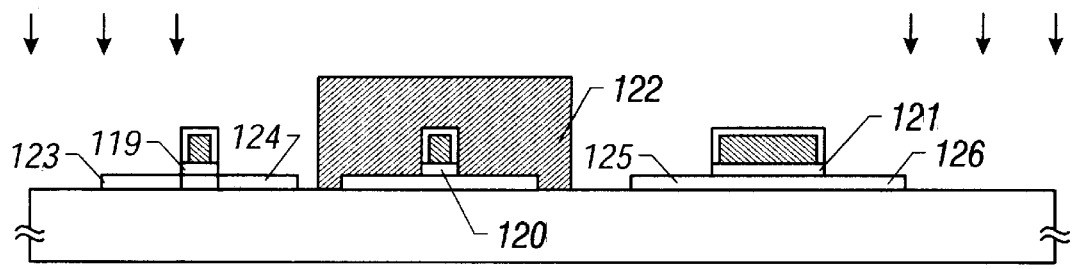

When the step of gettering the catalyst element has been finished as described above, an aluminum film (not illustrated) including 0.2 wt % of scandium is formed and an electrode pattern for constituting a prototype of a gate electrode, mentioned later, is formed. Further, a film of tantalum, tungsten, molybdenum, silicon or the like can be used in place of the aluminum film. Further, by anodically oxidizing the surface of the pattern, gate electrodes 113 through 115 and anodized films 116 through 118 are formed. (FIG. 1D)

Next, the gate insulating films 112 is etched self-addustingly with the gate electrodes 113 through 115 as m asks. T he etching may be carried out by using a dry etching process in use of $CHF_3$ gas. By this step, gate insulating films 119 through 121 remaining only right beneath gate electrodes are formed.

Next, after forming a resist mask 122 by covering a region for constituting a P-channel type TFT, impurity ions for providing N-type are added. The impurity ions may be added by the ion implantation process or the plasma doping process. Further, the concentration (represented by n–)in this case constitutes a concentration of an LDD (Lightly Doped Drain) region, mentioned later (about $1\times10^{18}$ through $1\times10^{19}$ atoms/cm³) and therefore, it is necessary to carry out fine control by obtaining previously an optimum value by experiment. In this way, n– regions 123 through 126 are formed. (FIG. 2E)

Figure 2A:
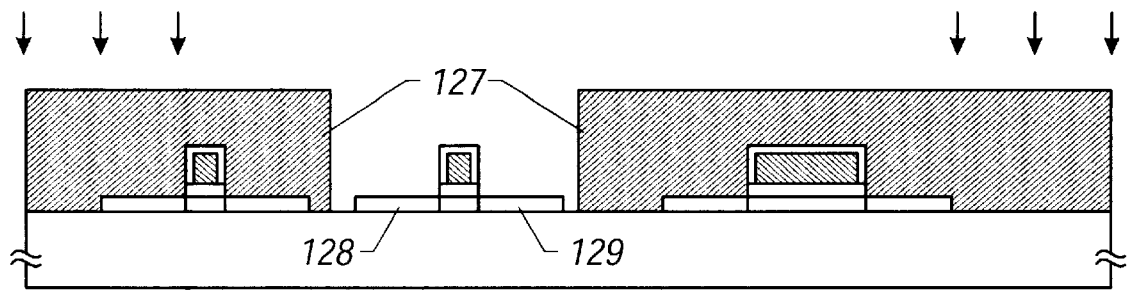
FIGS. 2A through 2D are views showing fabrication steps of the active matrix substrate.

After forming the n– regions 123 through 126, the resist mask 122 is removed and a resist mask 127 covering the N-channel type TFTs is formed successively. Further, impurity ions providing P-type are added and p– regions 128 and 129 are formed. Also the concentration of the p– regions 128 and 129 constitutes the concentration of LDD regions, mentioned later (about $5\times10^{18}$ through $5\times10^{19}$ atoms/cm³) and accordingly, it is necessary to carry out fine control. (FIG. 2A)

Figure 2B:
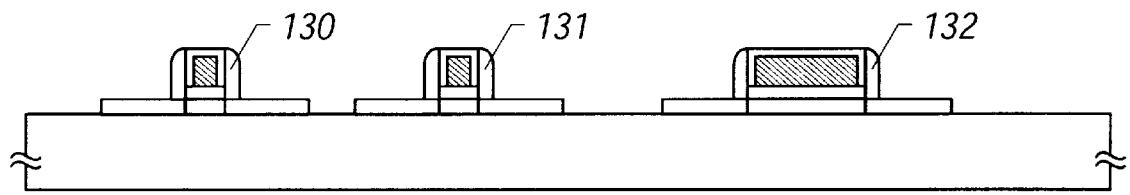

When the n– regions 123 through 126 and the p– regions 128 through 129 have been formed as described above, the resist mask 127 is removed. Further, silicon oxide films, not illustrated, are formed by a thickness of 0.5 through 2 µm and side walls 130 through 132 are formed by the etch back process. (FIG. 2B)

Next, a resist mask 133 is formed to cover the P-channel type TFT again and a step of adding impurity ions providing N-type is carried out. At this time, the impurity ions are added at a concentration (represented by n+) higher than n– which is the concentration of adding the impurity ions at a preceding time. The concentration adjusts the sheet resistance of the source/drain region to 500 Ω or lower (preferably, 300 Ω or lower)

Figure 2C:
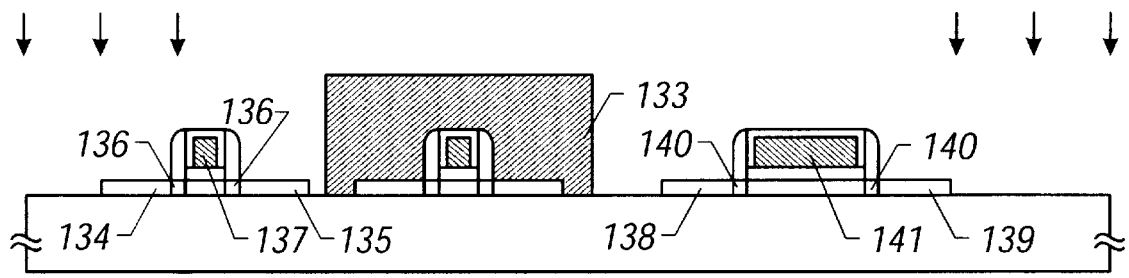

By this step, a source region 134 and a drain region 135 of the N-channel type TFT constituting the CMOS circuit is formed and regions 136 where concentration remains unchanged at backsides of the side walls, constitute low concentration impurity regions (particularly, the side of the drain region is referred to as LDD region). Further, a channel forming region 137 which is intrinsic or substantially intrinsic is formed right beneath the gate electrode. Also, simultaneously, a source region 138, a drain region 139, low concentration impurity regions 140 and a channel forming region 141 of the N-channel TFT constituting the pixel matrix circuit are formed. (FIG. 2C)

Figure 2D:
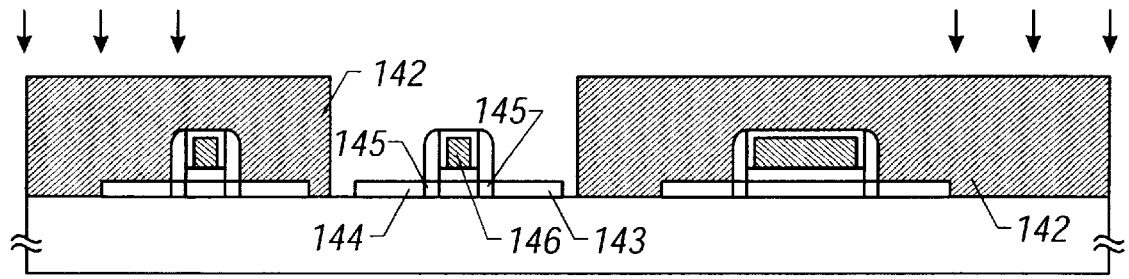

Next, the resist mask 133 is removed and a resist mask 142 is formed by covering the N-channel type TFTs. Further, by adding the impurity ions providing P-type added by a concentration (represented by p+) higher than that in the first time, a source region 143, a drain region 144, low concentration impurity regions 145 and a channel forming region 146 of the P-channel type TFT constituting the CMOS circuit are formed. (FIG. 2D)

All the activation layers are completed as mentioned above. After having finished the steps of adding all the impurity ions in this way, the resist mask 142 is removed and thereafter, the impurity ions are activated by a heating treatment of furnace annealing, laser annealing, lamp annealing or the like. Further, damage in implanting ions undergone by the activation layers are simultaneously recovered.

Figure 3A:
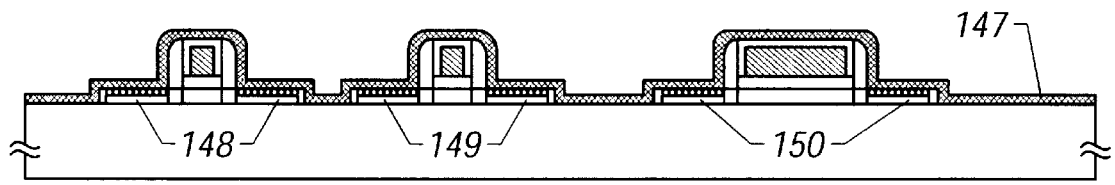
FIGS. 3A through 3C are views showing fabrication steps of the active matrix substrate.

Next, a titanium (Ti) film 147 is formed by a thickness of 20 through 50 nm and a heating treatment by a lamp annealing is carried out. At this moment, the silicon film which is brought into contact with the titanium film 147 is changed into a film of silicide and films of titanium silicide 148 through 150 are formed in the source/drain regions. Incidentally, cobalt (Co), tungsten (W), tantalum (Ta), molybdenum (Mo) or the like may be used in place of titanium. (FIG. 3A)

After finishing silicide formation, island-like patterns 151 through 153 are formed on the source/drain regions. The island-like patterns 151 through 153 are patterns for preventing the films of titanium silicide 148 through 150 from being eliminated in forming contact holes for connecting the source/drain regions and wirings in later steps.

Figure 3B:
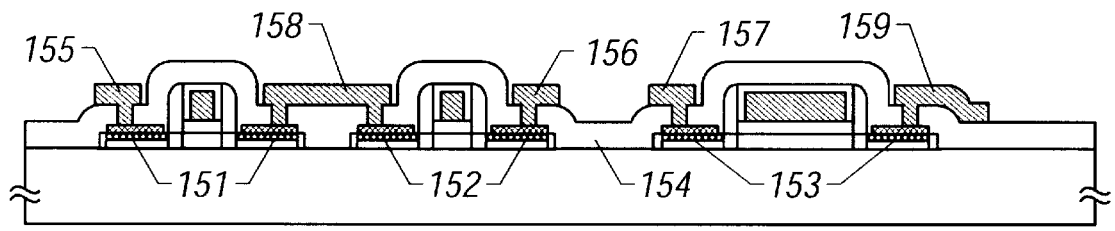

Next, a silicon oxide film is formed by a thickness of 0.3 through 1 $\mu$m as a first interlayer insulating film 154, contact holes are formed and source wirings 155 through 157 and drain wirings 158 and 159 are formed. In this way, a state shown by FIG. 3B is provided. Incidentally, an organic resin film can also be used as a first interlayer insulating film 154.

When the state shown by FIG. 3B is provided, a second interlayer insulating film 160 comprising an organic resin film is formed by a thickness of 0.5 through 3 $\mu$m. Polyimide, acrylic resin, polyamide, polyimide amide or the like is used for the organic resin film. As advantages of the organic resin film, 1) film forming process is simple, 2) film thickness can be thickened easily, 3) parasitic capacitance can be reduced since dielectric constant is low, 4) flatness is excellent and so on are pointed out.

Further, a black mask 161 comprising a film having light shielding performance is formed on the interlayer insulating film 160 by a thickness of 100 nm. Further, although in this embodiment, a titanium film is used as the black mask, a resin film including a black pigment or the like can also be used.

Figure 3C:
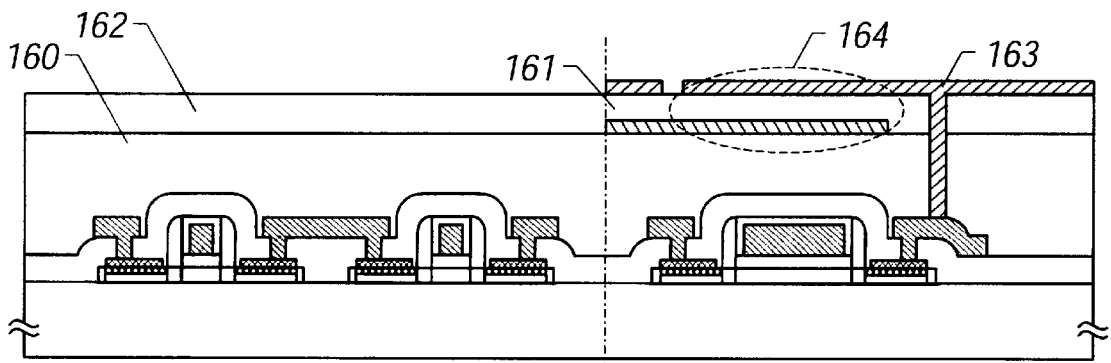

After forming the black mask 161, as a third interlayer insulating film 162, either of a silicon oxide film, a silicon nitride film and an organic resin film or a laminated film of these is formed by a thickness of 0.1 through 0.3 $\mu$m. Further, contact holes are formed at the second interlayer insulating film 160 and the third interlayer insulating film 162 and a pixel electrode 163 is formed by a thickness of 120 nm. At this occasion, an auxiliary capacitance 164 is formed at a region where the black mask 161 overlaps the pixel electrode 163. (FIG. 3C)

Next, a total of the substrate is heated at 350° C. for 1 through 2 hrs in the hydrogen atmosphere and a total of the element is hydrogenated by which dangling bonds (unpaired bonds) in the films (particularly in the activation layers) are compensated. After having been processed through the above-described steps, the CMOS circuit (left side) and the pixel matrix circuit (right side) can be formed on the same substrate.

(Knowledge with respect to crystal silicon film provided in the present invention)

Figure 8:
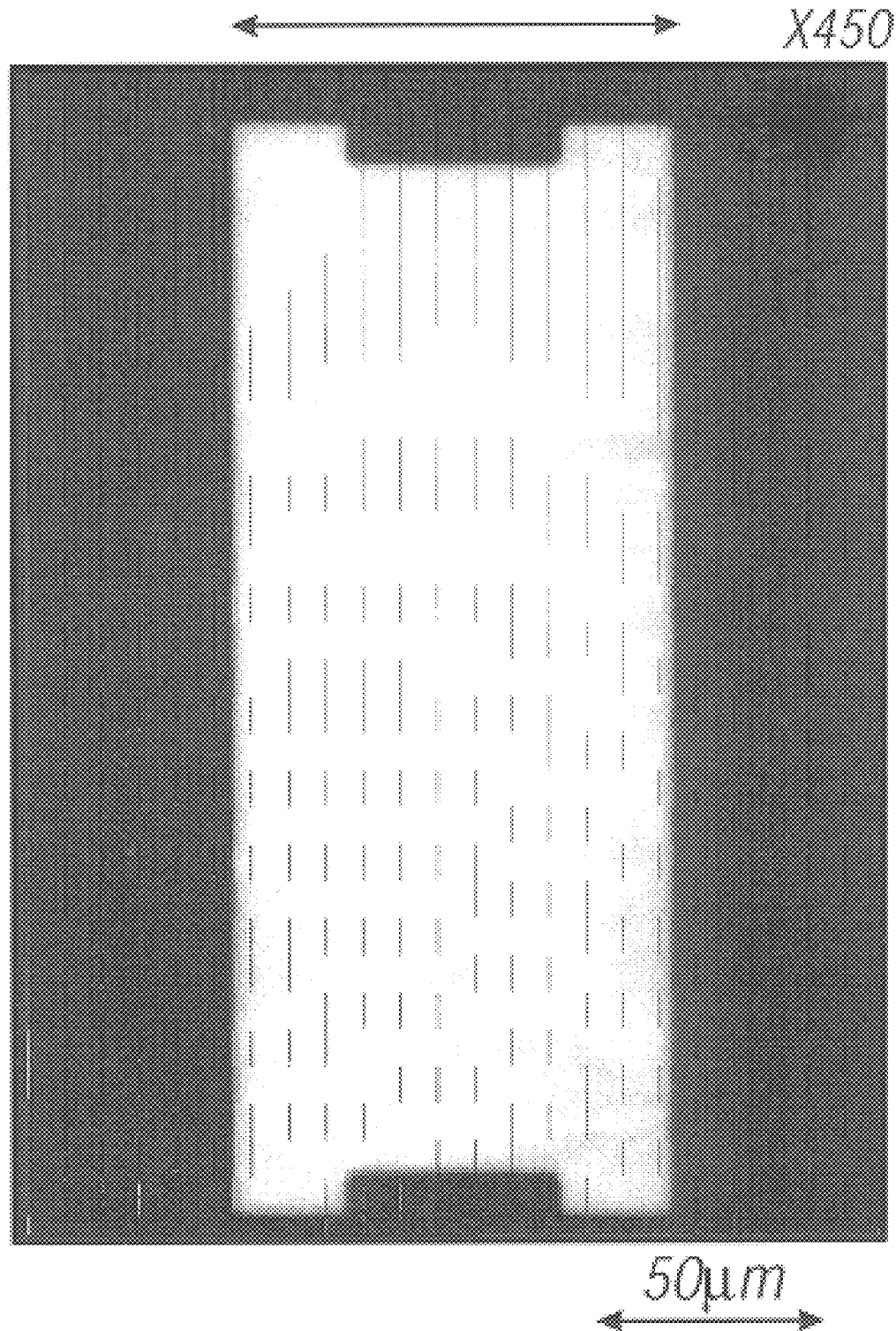
FIG. 8 is a microscopic photograph showing a crystal silicon film viewed from upper face.

The outlook of the activation layer formed in accordance with the above-described fabrication steps is as shown by FIG. 8. The activation layer shown by FIG. 8 is formed by using only the horizontal growth region having a length as large as several tens through one hundred and several tens $\mu$m. Further, the pattern of horizontal striations which can be recognized in FIG. 8 indicates the direction of crystal growth.

The horizontal growth region formed in accordance with the process disclosed in Japanese Unexamined Patent Publication No. JP-A-8-78329, is featured in that directions of crystals are aligned since rod-like crystals or flattened rod-like crystals are grown substantially in parallel with each other in a macroscopic view. It is effective in promoting the mobility of carriers to align the direction of moving carriers (direction from source region to drain region, designated by an arrow mark in photograph) with the direction of growing crystals as shown by FIG. 8 by utilizing the alignment. This is because scattering of carriers caused by collisions among the carriers is reduced since the direction of moving the carriers is rectified to a specific one direction by the grain boundaries.

Figure 9A:
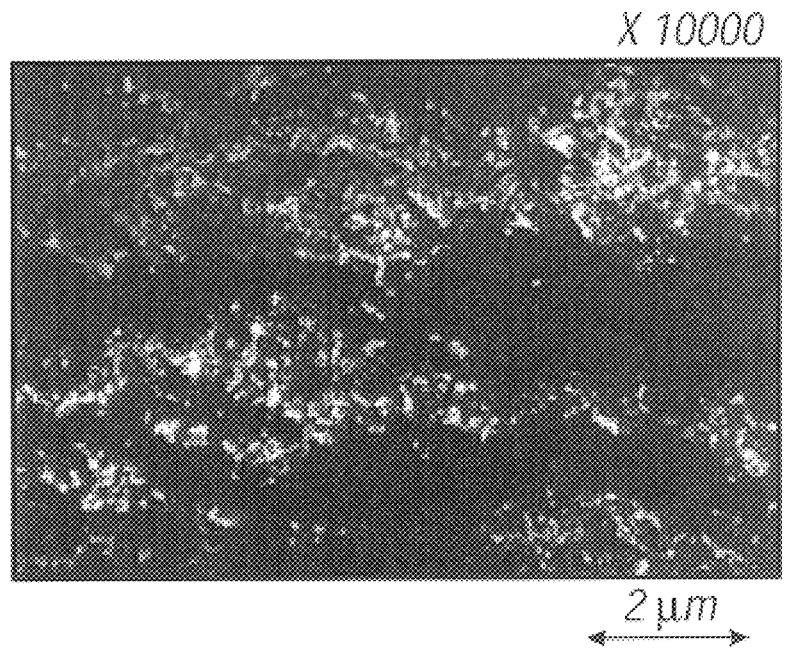
FIGS. 9A and 9B are TEM photographs showing crystal silicon films viewed from upper face.
Figure 9B:
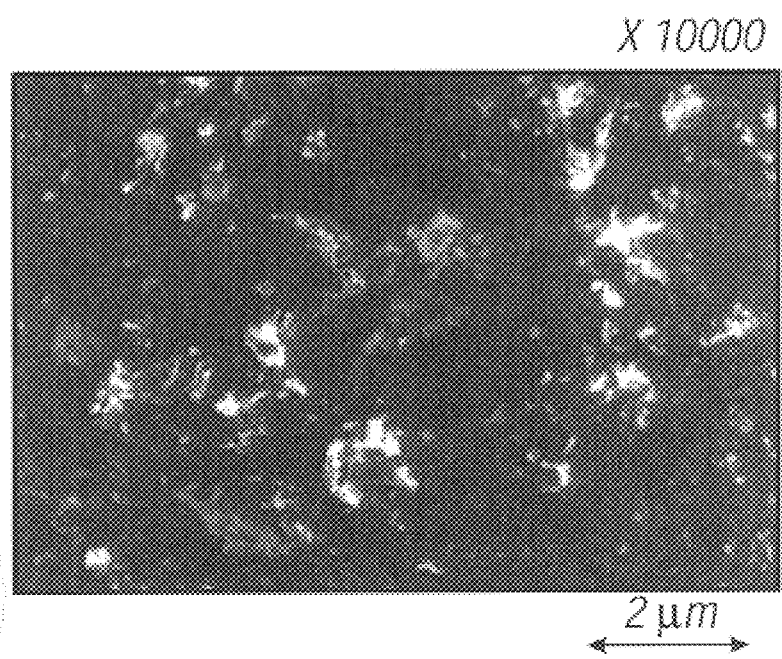

Next, FIGS. 9A and 9B show TEM (Transmission Electron Microscope) photographs (dark field) in which a crystal silicon film according to the present invention is magnified by 10,000. FIG. 9A shows a crystal silicon film according to the present invention and FIG. 9B shows a crystal silicon film generally referred to as high temperature polysilicon. According to the high temperature polysilicon film of FIG. 9B, an amorphous silicon film is crystallized by a thermal crystallization process at 600° C. for 24 hrs and no catalyst element is used.

Further, the dark region and the white region in the figures are caused by a difference in contrast due to a difference in face orientation of crystal and a crystal face substantially having the same face orientation seems to emerge in the white region. Therefore, the substantial growth direction of crystal can be confirmed by following the white region.

When FIG. 9A and FIG. 9B are compared with each other on the basis thereof, a flow of the white region can clearly be confirmed in the transverse direction of the drawing in FIG. 9A. That is, it is shown that the crystal silicon film according to the present invention is of a crystal structure where rod-like or flattened rod-like crystals which are grown with a specific orientation are aggregated. Further, the horizontal striation pattern in the arrow mark direction that is confirmed in reference to FIG. 8, seems to correspond to the white pattern confirmed in FIG. 9A.

In the meantime, in FIG. 9B, only the white regions in cluster-like lumps are scattered and the flow pattern cannot be recognized at all. That is, it seems that the high temperature polysilicon film is formed by aggregating a number of granular crystals.

As described above, the crystal structure of the crystal silicon film according to the present invention is quite different from that of the conventional high temperature polysilicon film.

Further, FIGS. 10A through 10D show HR-TEM photographs in which grain boundaries among the rod-like or flattened rod-like crystals are magnified by 4 million. By using HR-TEM (High Resolution Transmission Electron Microscope), arrangement of atoms and molecules is evaluated by irradiating an electron beam vertically to a sample and utilizing interference among transmitted electrons or elastically scattered electrons.

HR-TEM can observe the arrangement state of a crystal lattice as lattice striations. Accordingly, a state of bonding atoms at crystal boundaries can be predicted by observing the crystal boundaries. Incidentally, although the lattice striation is shown as a striation pattern of white and black, the striation shows a difference in contrast and does not show positions of atoms.

In this case, FIG. 10A shows a crystal silicon film according to the present invention and FIG. 10B shows a schematic diagram of a portion thereof. Further, FIG. 10C shows a high temperature polysilicon film and FIG. 10D shows a schematic diagram of a portion thereof.

In FIG. 10A, two crystals having different contrast are brought into contact with each other at a grain boundary at the center of photograph. Further, a striation pattern directed in the horizontal direction is observed at the crystal on the left side of the grain boundary and a lattice striation directed in an obliquely upward direction is observed at the crystal on the right side.

Further, a thin lattice striation intersecting with the lattice striation inherently to be seen and substantially in parallel with the lattice pattern of the crystal on the right side is seen in the lattice striation of the crystal on the left side. The thin lattice striation provides information of other lattice arrangement caused by an error in measurement. The error is observed when an electron beam is irradiated obliquely to a sample, however, it is technically extremely difficult to irradiate an electron beam quite vertically to two crystals and the error in measurement is unavoidable.

Next, FIG. 10B shows schematically inside of frame lines of FIG. 10A. Bold lines in FIG. 10B represent lattice striations and the lattice striations caused by the error and observed in the crystal on the left side are represented by dotted lines.

In this case, as shown by FIG. 10B, according to the lattice striations indicated by the bold lines, the lattice striations of the crystal on the left side and the lattice striations of the crystal on the right side are bonded to each other in one to one correspondence by which it is known that no disturbance of the lattice arrangement is caused even at a vicinity of the grain boundary.

Therefore, when HR-TEM photograph of FIG. 10A is observed in details, it can be confirmed that the lattice striations are continuously connected at the grain boundary even with the crystals different from each other and the compatibility of crystal lattice is very excellent. That is, it can be determined that almost no crystal defect such as unpaired bond is present at the bond (bond between atoms) at the grain boundary.

Meanwhile, according to the high temperature polysilicon film shown by FIG. 10C, the respective lattice striations observed in different crystals are bonded in disorder and as shown by FIG. 10D, it can be determined that a number of crystal defect (point defect) such as an unpaired bond 1001 are present. Therefore, it is anticipated that a number of traps for carriers are present at the grain boundary.

Further, a state of bonding atoms when lattice striations are in correspondence with each other with excellent compatibility as observed in FIG. 10A, is referred to as commensurate bonding and a bond in this case is referred to as commensurate bond. Further, a state of bonding atoms when lattice striations are not in correspondence with each other with excellent compatibility as frequently observed in FIG. 10C, is referred to as incommensurate bonding and a bond in this case is referred to as incommensurate bond (or unpaired bond).

As described above, it is confirmed that the crystal silicon film according to the present invention differs from a general high temperature polysilicon film also from detailed observation of grain boundaries by using HR-TEM analysis. Further, the following interesting knowledge is provided with respect to the crystal silicon film according to the present invention.

According to the inventors, among crystals constituting the crystal silicon film of the present invention, at a grain boundary between an arbitrary crystal (for example, referred to as crystal A) and a contiguous other crystal (for example, referred to as crystal B), a portion where the lattice striations of crystal A are not continuous to the lattice striations of crystal B, that is, incommensurate bonds are present only by a rate of 5% or lower (preferably, 3% or lower) in respect of all the bonds present at the grain boundary.

That is, the above-described fact signifies that a number of incommensurate bonds included in 100 of arbitrary bonds present at a grain boundary is 5 or smaller (preferably, 3 or smaller). The confirmation can be carried out easily by performing HR-TEM analysis. That is, the confirmation can be carried out by the fact that a number of lattice striations which are interrupted at the midways is 5 or smaller (preferably, 3 or smaller) when a region of bonding 100 of lattice striations is observed at an arbitrary region of a crystal grain.

Further, although it is described that the number of incommensurate bonds included in 100 of arbitrary bonds present at a grain boundary is 5 or smaller, the description signifies a maximum value thereof and actually, almost no incommensurate bonds are present. For example, when 50 of arbitrary bonds are observed, there are regions where the number of incommensurate bonds is 0.

Further, an angle made by lattice striations of the two crystals in FIG. 10A is about 70° (or 110°). Whether the sample is inclined in the TEM observation cannot be confirmed by FIG. 10A and therefore, the angle seems to fall in a range of 60° through 80° (or 100° through 120°) in consideration of an error caused by the inclination.

Further, according to the case of the crystal silicon film of the present invention, the crystal boundary highly possibly forms a special boundary referred to as inclined boundary. Such an inclined boundary is featured in that the boundary does not function as a trap for hampering movement of carriers despite the crystal grain boundary since the boundary is electrically inert. That is, it seems that the astonishing characteristic of TFT achieved by the present invention is derived from the inclined boundary.

An inclined boundary is a grain boundary formed when contiguous crystals are rotated with a crystal axis present in a grain boundary as a rotating axis ("High Resolution Electron Microscope Method for Material Evaluation", Daisuke Shindo and Kenji Hiraga, pp. 54–60, Kyoritu Shuppan Kabushiki Kaisha, 1996). In this case, the exposed faces (hereinafter, referred to as crystal faces) of two crystals forming an inclined boundary indicate the same face orientation and the face orientation coincides with the rotated axis. That is, the inclined boundary cannot be formed unless the crystal faces of two crystals indicate the same face orientation.

It is known as a basic knowledge in observing lattice striations that the face orientation of the exposed face can be predicted by comparing a number of lattice striations observed per unit length with the unit lattice constant of crystal. The inventors have carried out many times of the above-described observation with respect to the crystal silicon film according to the present invention and determined that all of the crystal faces are provided with substantially the same face orientation (111).

Further, when the above-described observation was carried out in the case of the high temperature polysilicon film, various face orientations were confirmed with respect to the crystal face and it could be confirmed that the inclined boundary could not be formed.

Further, according to the above-described reference (High Resolution Electron Microscope Method for Material Evaluation), there is an inclined boundary that is referred to as corresponding boundary. A corresponding boundary is a grain boundary having particularly excellent compatibility among inclined boundaries (typical one is twin boundary) and the degree of compatibility can be represented by $\Sigma$ value.

For example, the smaller the Σ value, the more excellent is the compatibility of a boundary between two contiguous crystals (corresponding boundary). Particularly, it has been reported that when the rotating axis is represented by an orientation of [111], in the case where a rotating angle (which may be considered as an angle made by lattice striations of two crystals) is 60°, the τ value is 3 that is a minimum value.

As described above, according to the crystal silicon film of the present invention, the face orientation is (111) and therefore, the rotating angle is [111]. Therefore, the fact that the rotating angle of two different crystals falls in a range of 60 through 80° in a grain boundary included in the crystal silicon film of the present invention, indicates that the crystal silicon film according to the present invention is highly possibly a corresponding boundary.

In forming the crystal silicon film of the present invention, an annealing process (a process shown in FIG. 1C, in case of this embodiment) at a temperature higher than a crystallizing temperature plays an important role in a reduction of defects in the crystal grain. This will be described.

Figure 17A:
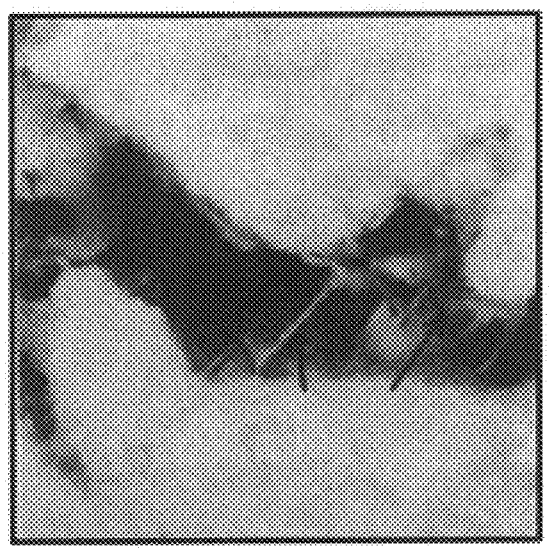
FIGS. 17A and 17B are TEM photographs showing crystal silicon films.

FIG. 17A is a TEM photograph showing a crystal silicon film enlarged as 250,000 times as large as the original, at the time of the completion of the processes until the crystallizing process shown in FIG. 1B, and it is recognized from the photograph that a detect appears in the form of a zigzag within the crystal grain (a black portion and a white portion appear due to a difference in contrast) as indicated by an arrow.

The defect of this type is mainly caused by a lamination defect where the laminating order of atoms in the surface of the silicon crystal lattice is inconsistent. However, the defect may be caused by transition, and so on. It is presumed that FIG. 17A shows the lamination defect having a defect surface in parallel to the {111} face. This can be presumed from the fact that the defect appearing in the form of a zigzag is bent at an angle of about 70°.

Figure 17B:

On the other hand, as shown in FIG. 17B, in the crystal silicon film of the present invention, which is viewed with the same magnification as the photograph of FIG. 17A, defects caused by the lamination defect or transition are hardly found within the crystal grain. Thus, it can be recognized that the crystal silicon film is very high in crystallinity. This tendency is applicable to the entire film surface. In the existing circumstances, it is difficult to make the number of defects zero, however, it is possible to reduce it to substantially zero.

In other words, the crystal silicon film can be regarded as monocrystal or substantially monocrystal since the defects within the crystal grain are reduced as much as they can be nearly ignored, and also the grain boundary cannot be brought into a barrier of the carrier movement because of high continuity.

As described above, the crystal silicon films shown in the photographs of FIGS. 7A and 7B have substantially the same continuity but have a large difference in the number of defects within the crystal grains. The reason that the crystal silicon film of the present invention exhibits a considerably higher electric characteristic than that of the crystal silicon film shown in FIG. FIG. 17A is mainly that there is the difference in the number of defects therebetween.

It is found from the above that the process shown in FIG. 1C is a process essential for the present invention. The present inventors propose the following model of the phenomenon occurring in this process.

First, in the state shown in FIG. 17A, catalyst elements (representatively, nickel) are segregated in the defects (mainly, lamination defects) within the crystal grain. In other words, it is presumed that there are a large number of bondings such as Si—Ni—Si.

However, when Ni existing in the defects is removed by conducting a gettering process of the catalyst elements, Si—Ni bonding is cut. As a result, non-bondings of silicon form Si—Si bonding for stabilization. Thus, the defects disappear.

It is needless to say that there has been known that the defects in the crystal silicon film disappear due to thermal annealing at a high temperature. However, in the present invention, it can be presumed that because bondings of silicon and nickel are cut so that a large number of non-bondings occur, re-bondings of silicon are more smoothly conducted.

At the same time, it is presumed that excessive silicon atoms occurring when the crystal silicon film is thermally oxidized are moved toward the defects for pursuing stabilization, and greatly contributes to the production of Si—Si bondings. This concept has been known as a cause that little defects exist within the crystal grain in the so-called high-temperature polysilicon film.

Also, the present inventors propose that the crystal silicon film and its under film are fixed to each other by conducting a heat treatment at a temperature exceeding the crystallizing temperature (representatively, 700 to 1100° C.) to enhance adhesion therebetween, with the result that the defects disappear.

The crystal silicon film and the silicon oxide film that forms the under film are different in thermal expansion coefficient nearly 10 times. Therefore, in the stage where the amorphous silicon film is transformed into the crystal silicon film (FIG. 17A), an extremely large stress is exerted on the crystal silicon film when the crystal silicon film is cooled.

Figure 18A:
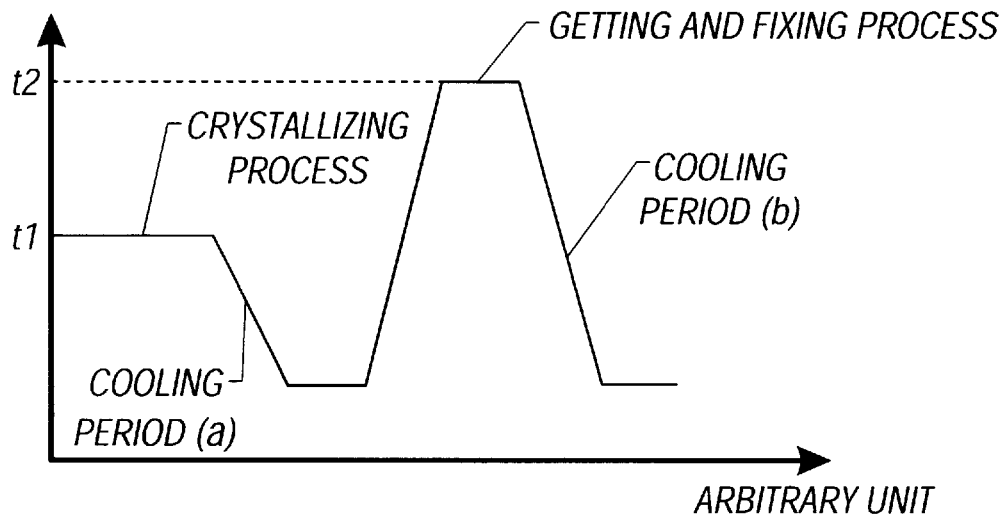
FIG. 18A shows a heat history applied to a crystal silicon film.

This phenomenon will be described with reference to FIGS. 18A to 18C. FIG. 18A shows a heat history applied to the crystal silicon film after the crystallizing process. First, the crystal silicon film crystallized at a temperature ($t_1$) is cooled to a room temperature after a cooling period (a) elapses.

Figure 18B:
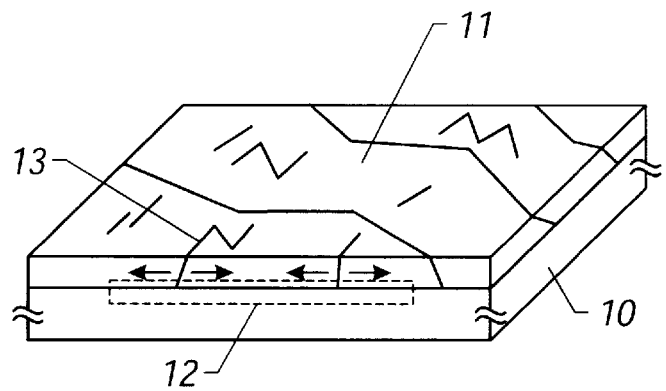
FIG. 18B shows a crystal silicon film during a cooling period (a).
Figure 18C:
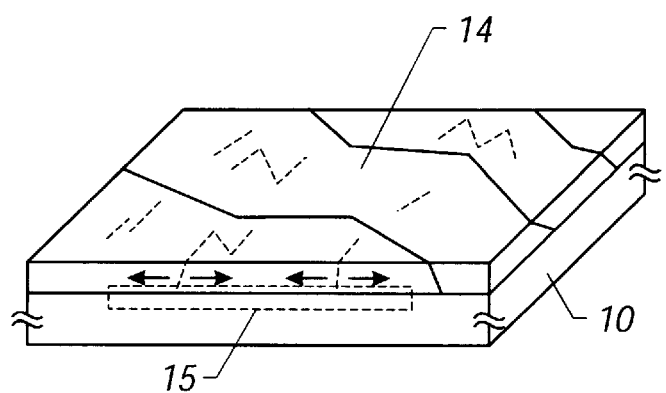
FIG. 18C shows a crystal silicon film during a cooling period (b).

In this example, what is shown in FIG. 18B is a crystal silicon film during the cooling period (a), and reference numeral 10 denotes a quartz substrate, and 11 is a crystal silicon film. In this state, it is presumed that a boundary 12 between the crystal silicon film 11 and the quartz substrate 10 is not very high in adhesion, which causes a large number of defects to occur within the grain.

In other words, it is presumed that the crystal silicon film 11 stretched due to the difference in thermal expansion coefficient is very liable to move on the quartz substrate 10, and defects 13 such as the lamination defect or the transition are readily generated with a force such as a tensile stress.

The crystal silicon film thus obtained comes to a state shown in FIG. 17A. Thereafter, as shown in FIG. 18A, the process of gettering the catalyst elements is conducted at a temperature ($t_2$), as a result of which the defects in the crystal silicon film disappear for the above-described reason.

What is important is that simultaneously when the process of gettering the catalyst elements is conducted, the crystal silicon film is fixed to the quartz substrate to enhance adhesion to the quartz substrate. In other words, it is presumed that the gettering process serves also as a process of fixing the crystal silicon film to the quartz substrate (the under film).

Thus, upon the completion of the gettering and fixing process, the crystal silicon film is cooled to the room temperature after a cooling period (b) elapses. What is different from the cooling period (a) after the crystallizing process resides in that the boundary 15 between the quartz substrate 10 and the crystal silicon film 14 after being annealed is very high in adhesion (FIG. 18C).

Since this high adhesion allows the crystal silicon film 14 to be completely fixed to the quartz substrate 10, even if a stress is exerted on the crystal silicon film in the stage of cooling the crystal silicon film, this does not come to a conclusion that defects occur. In other words, re-generation of defects can be prevented.

FIG. 18A exemplified the process of lowering the temperature to the room temperature after the crystallizing process. Alternatively, after the completion of crystallization, the temperature may be made to rise to conduct the gettering and fixing process. Similarly, this process enables the crystal silicon film of the present invention to be obtained.

The crystal silicon film thus obtained according to the present invention (FIG. 17B) is characterized in that the number of defects within the crystal grain is remarkably reduced in comparison with the crystal silicon film which is merely crystallized (FIG. 17A).

The difference in the number of defects is exhibited as a difference in the density of spins through an electron spin resonance (ESR) . In the existing circumstance, it is proved that the density of spins of the crystal silicon film according to the present invention is at least $5\times10^{17}$ spins/cm$^3$ or less (preferably $3\times10^{17}$ spins/cm$^2$ or less). However, it is presumed that since the measured value is close to a detection limit of the existing measuring device, an actual density of spins is further lowered.

The crystal silicon film having the above-described crystal structure and features according to the present invention is called "continuous grain silicon (CGS)".

(Knowledge concerning TFT provided by present invention)

Figure 11:
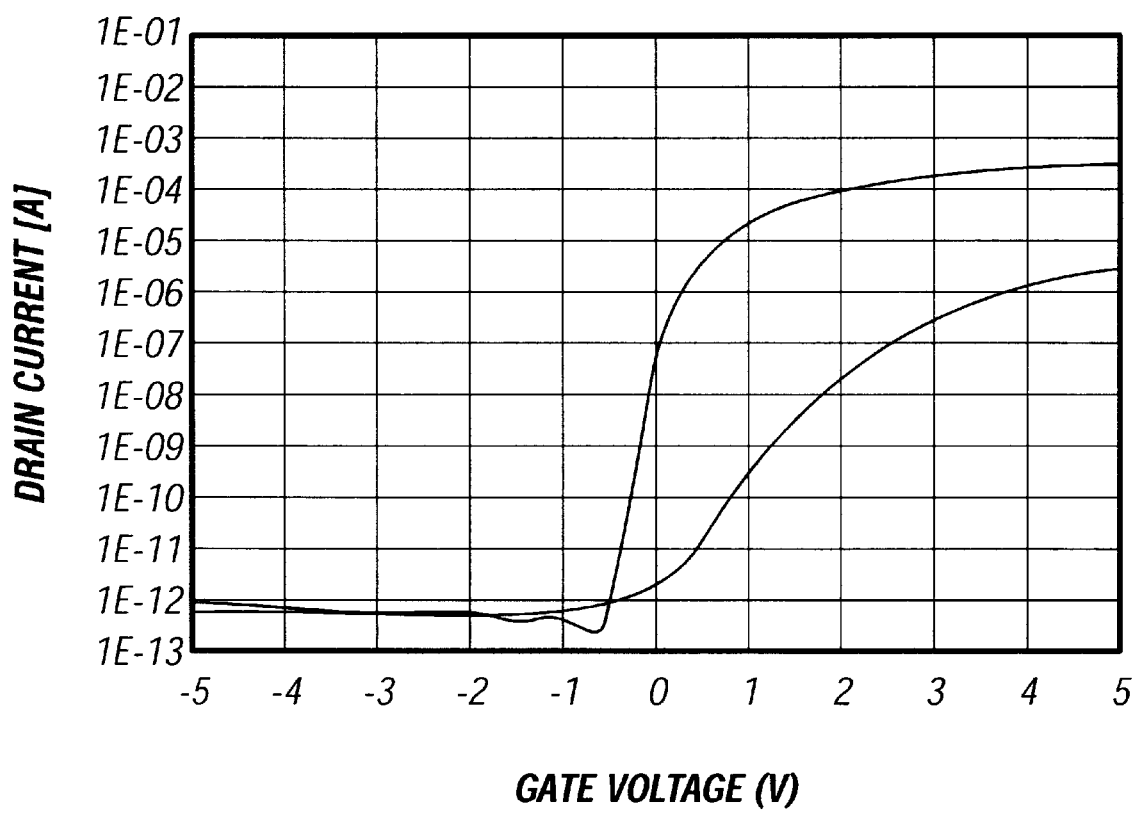
FIG. 11 is a diagram showing electric characteristic of TFT.

TFT fabricated with the above-described crystal silicon film as an activation layer shows an electric property as shown by FIG. 11. FIG. 11 shows Id-Vg curve (Id-Vg characteristic) of an N-channel type TFT plotted with the abscissa of a gate voltage (Vg) and the ordinate of a drain current (Id) in logarithm. Further, the measurement of the electric property was carried out by using a device on sale (made by Hewlett Packard: type No. 4145B).

In FIG. 11, numeral 1101 shows the electric property of an N-channel type TFT by utilizing the activation layer provided by the above-described steps and numeral 1102 shows the electric property of conventional TFT. The conventional TFT indicates TFT fabricated by steps where a step of gettering process of a catalyst element is deleted from the above-described steps.

When the transistor characteristics of both are compared, it can firstly be confirmed that even with the same gate voltage, ON current which is larger by substantially 2 through 4 digit flows according to the characteristic designated by numeral 1101. Incidentally, ON current signifies drain current which flows when TFT is in ON state (when gate voltage falls in a range of about 0 through 5 V in FIG. 11).

Further, it can be confirmed that the characteristic designated by numeral 1101 is provided with more excellent sub-threshold characteristic. The sub-threshold characteristic is a parameter showing steepness of switching operation of TFT and the steeper the rise of Id-Vg curve when TFT is switched from OFF state to ON state, the more excellent is the sub-threshold characteristic.

Incidentally, the representative electric characteristics of TFT provided by the present invention are as follows.

(1) The sub-threshold coefficient which is a parameter indicating the switching function (swiftness in switching ON/OFF operation) of TFT is as small as 60 through 100 mV/decade (representatively, 60 through 85 mV/decade) both in an N-type TFT and a P-type TFT. Further, this data value is substantially equivalent to that of an insulated gate type field effect transistor (IGFET) using single crystal silicon.

(2) The field effect mobility ($\mu_{FE}$) which is a parameter indicating fastness of the operational speed of TFT is as large as 200 through 650 cm$^2$/Vs (representatively, 250 through 300 cm$^2$/Vs) for an N-type TFT and 100 through 300 cm$^2$/Vs (representatively, 150 through 200 cm$^2$/Vs) for a P-type TFT.

(3) The threshold voltage ($V_{th}$) which is a parameter constituting a criterion of the drive voltage of TFT is as small as −0.5 through 1.5 V for an N-type TFT and −1.5 through 0.5 V for a P-type TFT. This means that power consumption can be reduced by driving TFT by small power source voltage.

As described above, TFT according to the present invention is provided with extremely excellent switching characteristic and high speed operational characteristic. Further, TFT according to the present invention is featured in that the TFT hardly suffers influence of short channel effect owing to the peculiar crystal structure. An explanation will be given thereof as follows.

The short channel effect is a phenomenon where TFT characteristic is deteriorated when the channel length (which is substantially equal to the gate length) becomes very small and typical phenomena are lowering of threshold voltage, lowering of drain withstand voltage and so on, it has been reported that as a cause, the depletion layer on the drain side is expanded to the source side by which potentials at the source and a vicinity of the channel region are changed and control by gate voltage becomes difficult. Incidentally, details in respect of the short channel effect is described in "Physics of VLSI Device", Mitsumasa Koyanagi et al., Maruzen, 1986.

However, it has been confirmed that TFT according to the present invention is a TFT which is provided with both of extremely high operational speed and high drain withstand voltage even in the case where the channel length is as short as around 0.5 μm and which is highly reliable in evaluation by an acceleration test.

The inventors predict that the grain boundaries effectively function as the reason of high drain withstand voltage of TFT according to the present invention. The way of thinking in this case is that in the channel forming region, the grain boundaries extending substantially in parallel with the direction of moving carriers serve as an energy barrier and the widening of the depletion layer from the drain region is effectively restrained and accordingly, the lowering of the drain withstand voltage caused by punch through phenomenon can effectively be restrained.

Further, the capability of forming the channel forming region by using a crystal silicon film which is intrinsic or substantially intrinsic, can be regarded as a factor for realizing the high field effect mobility. Incidentally, being intrinsic or substantially intrinsic signifies that at least one of the following conditions is satisfied.

1) Activation energy of a silicon film is about ½ (Fermi level is disposed substantially at center of prohibitor).

2) The channel forming region is a region where the impurity concentration is lower than the spin density.

3) The channel forming region is a region which is undoped or intrinsic where no impurity is added intentionally.

Although the above-described survey with respect to restriction of the short channel effect is nothing but a prediction by the inventors, measured data of TFT is a fact and that TFT is provided with excellent function which is totally different from that of TFT using the conventional silicon thin film is also a fact.

(Characteristic of circuit constituted by TFT according to the present invention)

Next, the frequency characteristic of a ring oscillator fabricated by using TFT of the present invention by the inventors will be shown. A ring oscillator is a circuit where inverter circuits each comprising a CMOS structure are connected by odd number stages in a ring-like shape and is utilized to calculate delay time per stage of invertor circuit. The ring oscillator used in the experiment is as follows.

Number of stage: 9

Film thicknesses of gate insulating film of TFT: 30 nm and 50 nm

Gate length of TFT: 0.6 μm

Figure 12:
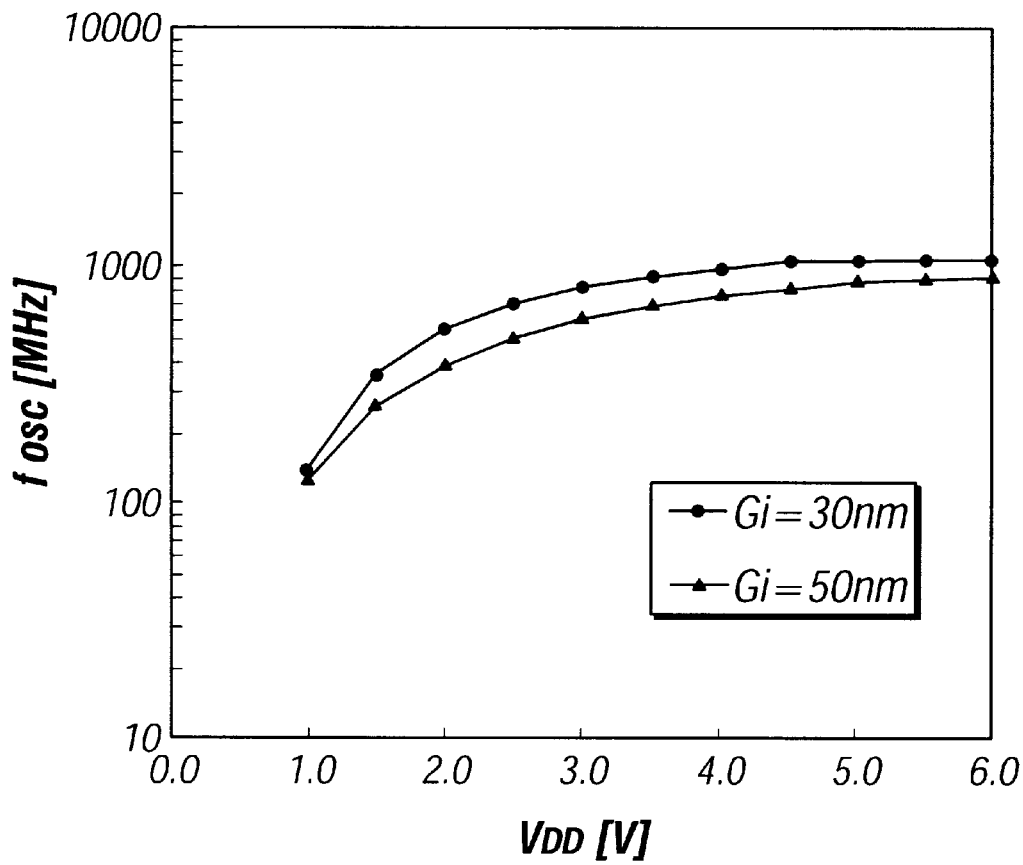
FIG. 12 is a diagram showing frequency characteristic of a ring oscillator.

FIG. 12 shows a result of measuring the oscillation frequency by a spectrum analyzer when the power source voltage of the ring oscillator is 5 V. In FIG. 12, the abscissa designates power source voltage ($V_{DD}$) and the ordinate designates oscillation frequency ($f_{osc}$). As shown by FIG. 12, when TFT having a gate insulating film of 30 nm is used, the oscillation frequency of 1 GHz or higher is realized.

Figure 13:
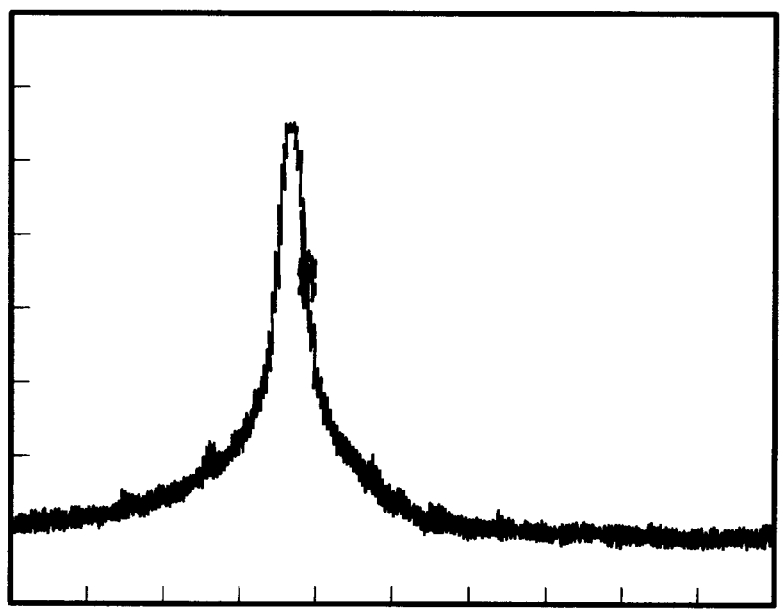
FIG. 13 is a photograph showing an output spectrum of the ring oscillator.

FIG. 13 shows behavior of an out put spectrum of the spectrum analyzer when the oscillation frequency of 1.04 GHz is provided. The abscissa designates the frequency in a range of from 1 through 1.1 GHz and the ordinate designates a voltage (output amplitude) in log scale. As is apparent in FIG. 13, a peak of output spectrum is shown at the frequency of 1.04 GHz. Incidentally, the output spectrum tails down due to the resolution of the device which does not effect influence on experimental result.

Figure 14:
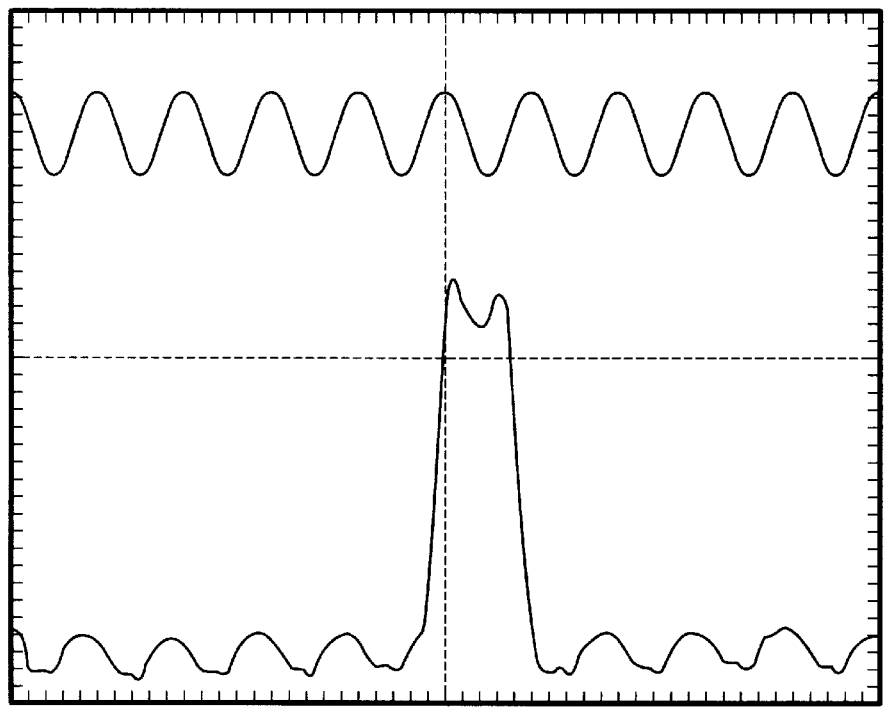
FIG. 14 is a photograph showing output pulses of a shift register.

Further, a shift register which is one of TEG (Test Element Group) of an LSI (Large Scale Integrated) circuit was actually fabricated and an output pulse when the shift register was driven at the operational frequency of 10 through 100 MHz was confirmed by which the operational .function of the shift register was investigated. A screen of an oscilloscope (upper side indicates clock pulse and lower side indicates output pulse) shown by FIG. 14 represents an output pulse of a shift register circuit having the film thickness of a gate insulator film of 30 nm, the gate length of 0.6 μm, the operational frequency of 100 MHz, the power source voltage of 5 V and the number of stages of 50.

Figure 15:
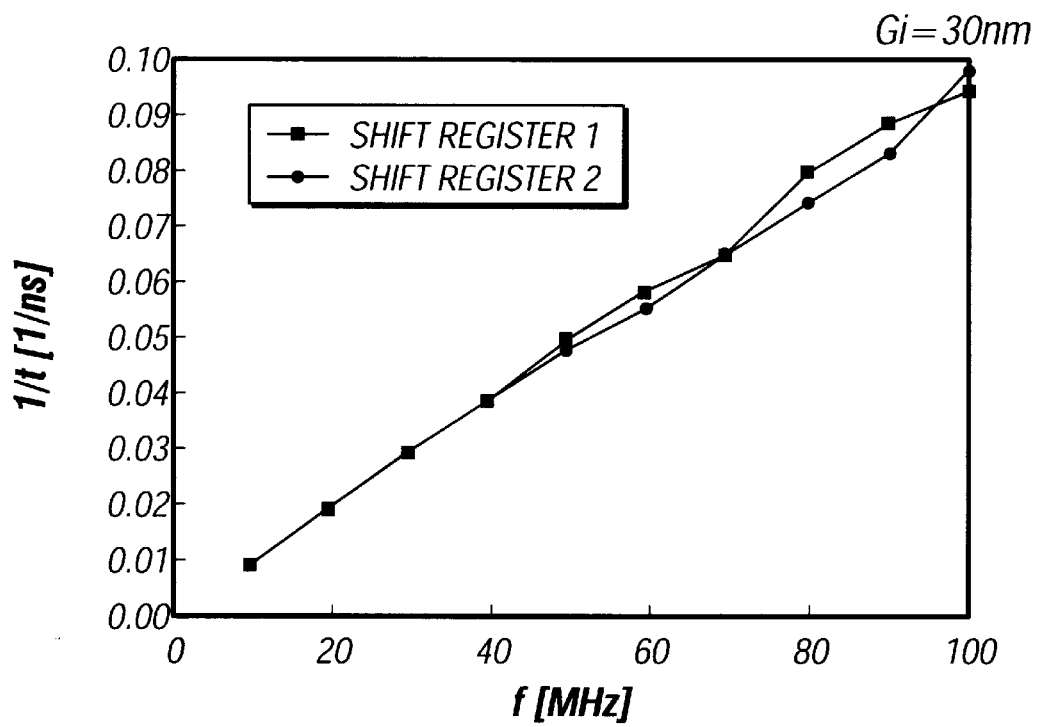
FIG. 15 is a diagram showing a relationship between frequency and pulse width of the shift register.

As a result of confirmation by the inventors, as shown by FIG. 15, an inverse number of an output pulse width "t" (ordinate) and the operational frequency (abscissa) are in a proportional relationship and it has been found that this was a shift register having an extremely high function capable of carrying out high frequency drive of 100 MHz by itself where the output pulse could be provided in an ideal state with no blunt. Incidentally, two kinds of shift registers having more or less different circuit constitutions were used in the experiment and the respectives are referred to as shift register 1 and shift register 2.

The astonishing data of the ring oscillator and the shift register as mentioned above, indicates that TFT according to the present invention which is constituted by a peculiar crystal structure, is provided with the function equivalent to or surpassing over IGFET using single crystal silicon.

Figure 16:
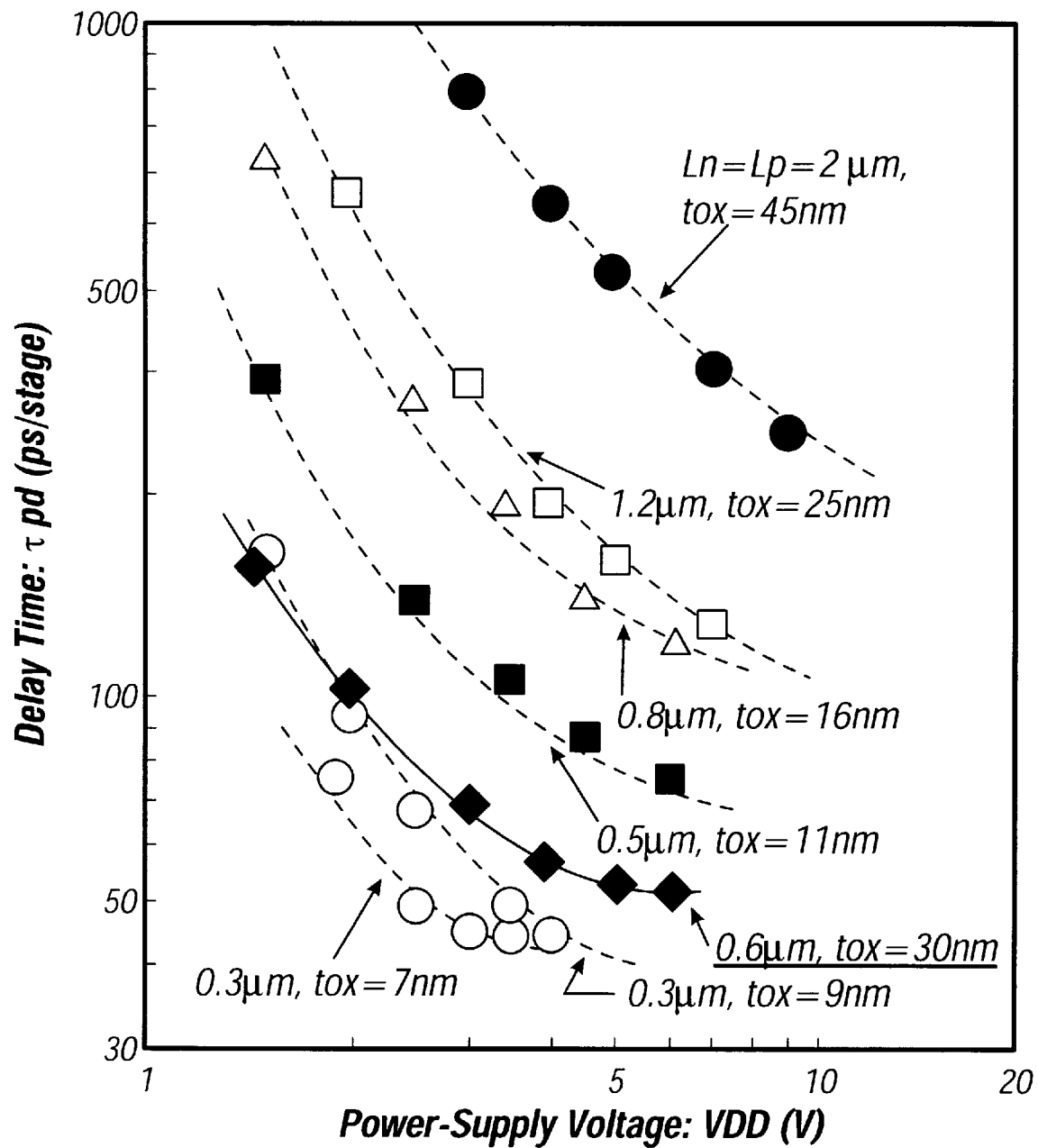
FIG. 16 is a diagram showing the scaling law.

The following data will be shown as a proof for backing the fact. Data shown in FIG. 16 are graphs where the abscissa designates a power source voltage ($V_{DD}$) and the ordinate designates a delay time ($\tau_{pd}$) per stage of an inverter of F/O=1 (fan-out ratio is 1) ("Innovation of Logic LSI Technology", Kenji Maeguchi et al., p. 108, Kabushiki Kaisha Science Forum, 1995). Various curves (indicated by dotted lines) in the diagram are data when FET (Field Effect Transistor) utilizing single crystal silicon is fabricated according to various design rules, which shows a so-called scaling law.

When the relationship between delay time and power source voltage of an inverter provided by using the above-described ring oscillator is applied to this diagram, a curve designated by a bold line is plotted in FIG. 16. What must be paid attention is that an inverter fabricated by TFT having the channel length of 0.6 μm and the film thickness of the gate insulating film of 30 nm has a function superior to an inverter fabricated by IGFET having the channel length of 0.5 μm and the film thickness ($t_{OX}$) of the gate insulating film of 11 nm.

The fact truly indicates that TFT provided by the inventors has a function superior to that of IGFET. For example, even when the film thickness of the gate insulating film constituting the above-described TFT is made three times as large as that of IGFET, the function of TFT equivalent to or superior to that of IGFET can be achieved. Accordingly, TFT according to the present invention is provided with the insulating withstand voltage which is superior to that of IGFET having the equivalent characteristic in respect of the operational function.

At the same time, when TFT according to the present invention is miniaturized in accordance with the scaling law, higher function can be realized. The present invention is hardly influenced by the short channel effect and accordingly, it is anticipated that the operational frequency of 9 GHz can be realized according to the scaling law when, for example, a ring oscillator is fabricated by 0.2 μm rule (since the operational frequency "f" is inversely proportional to square of the channel length L).

As described above, it has been confirmed that TFT according to the present invention is provided with extremely excellent characteristic and a semiconductor circuit formed by using TFT is a quite new TFT capable of realizing the high speed operation of 10 GHz or higher.

(Embodiment 2)

This embodiment shows an example of steps different from the fabrication steps described in Embodiment 1. Specifically, before forming an activation layer, the heating treatment is carried out in respect of a crystalline silicon film in an atmosphere including halogen element by which nickel is removed by gettering.

By combining the step described in the embodiment with Embodiment 1, the concentration of nickel in the activation layer can be reduced further effectively.

Also, the film thickness of the crystalline silicon film is reduced by the heating treatment exceeding 700° C. and therefore, an effect of thinning the activation layer is achieved. When the film thickness is thinned, effects of promotion of mobility and reduction in OFF current can be expected.

(Embodiment 3)

Although according to Embodiment 1, an example of carrying out the gettering process of catalyst element after forming the gate insulating film has been shown, according to the embodiment, the gettering process is carried out immediately after forming the activation layer and a thermally oxidized film in that case is used as a gate insulating film.

In this case, the film thickness of the gate insulating film is determined by the film thickness of the thermally oxidized film and accordingly, an extremely thin gate insulating film of about 10 nm can be formed by adjusting conditions of the heating treatment. Incidentally, it is a publicly-known fact that the mobility of carriers is promoted by thinning the gate insulating film.

In this way, this embodiment is featured in that a semiconductor device capable of carrying out high speed operation can be formed and steps of forming the gate insulating film can be simplified when the gate insulating film is constituted only by the thermally oxidized film. However, attention must be paid to uniformly constituting the film thickness.

(Embodiment 4)

The constitution shown by FIG. 3C of Embodiment 1 is an example of a TFT side substrate (referred to as active matrix substrate) of an active matrix type display device using the present invention and various circuits can be constituted by CMOS circuits.

Figure 4:
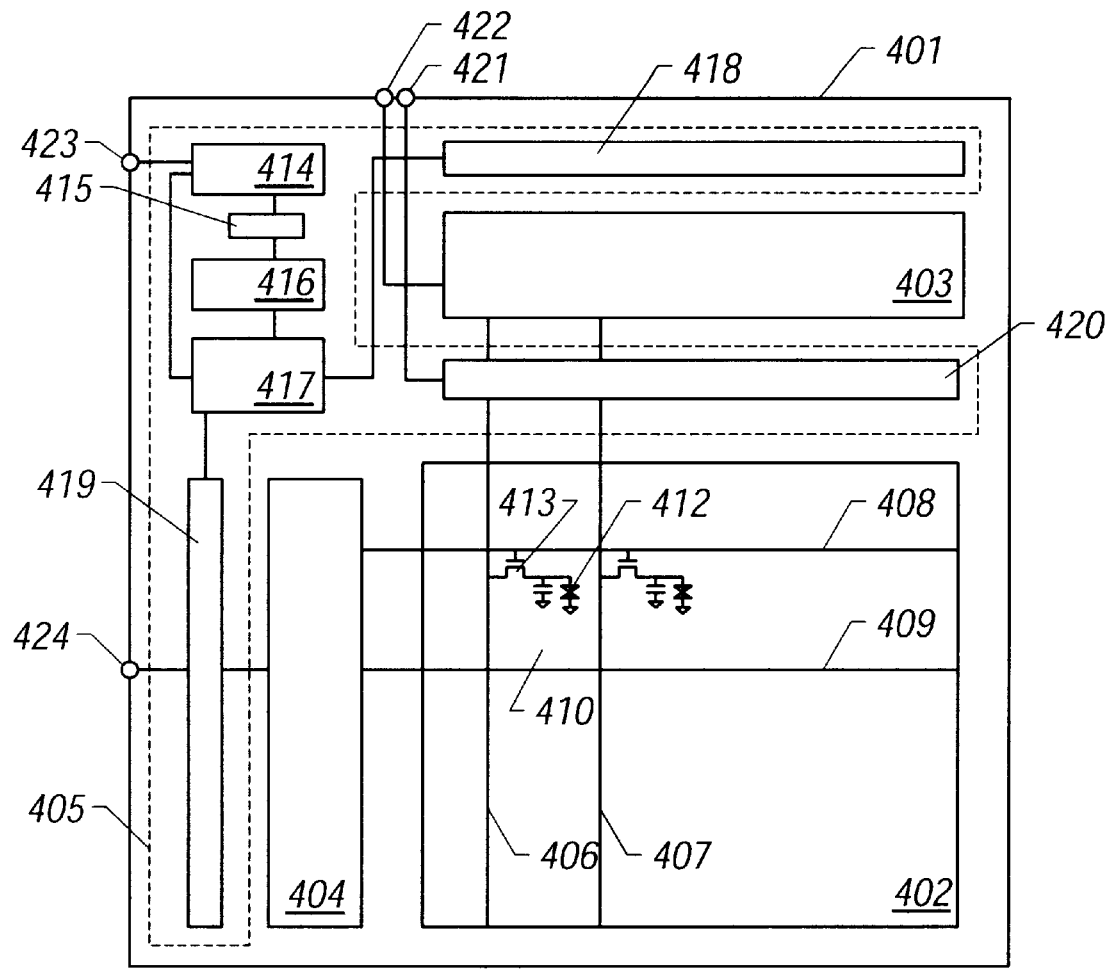
FIG. 4 is a view for explaining an example of an active matrix substrate.

FIG. 4 shows a block diagram indicating other example of an active matrix substrate constituted by using the present invention. In this case, a pixel matrix circuit 402, a source line driver circuit 403, a gate line driver circuit 404 and a logic circuit 405 are integrally formed on a substrate 401. Incidentally, this embodiment shows an example in correspondence with a digital constitution.

The source line driver circuit 403 is mainly constituted by a shift register (counter+decoder can also be used), a level shifter, a buffer, a latch circuit and the like and the gate line driver circuit 404 is mainly constituted by a shift register, a multiplexer, a level shifter, a buffer and the like.

Further, the pixel matrix circuit 402 is constituted by arranging a plurality of pixel regions 410 surrounded by a plurality of source lines 406 and 407 and a plurality of gate lines 408 and 409 in a matrix.

Further, the plurality of pixel regions 410 are constituted to include pixel TFTs 411, liquid crystal cells 412 and auxiliary capacitances 413. Further, although not illustrated, the liquid crystal cell 412 is constituted by a pixel electrode, an opposed electrode and a liquid crystal interposed therebetween.

The logic circuit 405 refers to a general circuit necessary for carrying out signal processing necessary for performing image display such as processing of start pulse, clock signal and the like for driving the source line driver circuit 403 and the gate line driver circuit 404, processing of video signal for displaying an image in the pixel matrix circuit 402 and so on.

According to the embodiment shown by FIG. 4, the logic circuit 405 is constituted to include a phase comparator 414, LPF (Low Pass Filter) 415, VCO (Voltage Control Type oscillator) 416, a divider 417, an oscillator 418 for source line driver (for horizontal scanning), an oscillator 419 for gate line driver (for vertical scanning) and a D/A converter (digital/analog converter) 420.

Incidentally, the inventors think that it is possible to also realize a system display monolithically mounted with other logic circuits not illustrated here, for example, an image sensor, CCD (Charge Coupled Device), an I/O (Input/Output) port for inputting and outputting signal transmitted to and from these circuits, an amplifier group circuit (differential amplifier, operational amplifier, comparator and so on) a memory for storing data (RAM (Random Access Memory) or ROM (Reed Only Memory)) and CPU (Central Processing Unit).

Further, numeral 421 designates an input terminal of an analog signal in accordance with a digital grey scale signal, numeral 422 designates an input terminal of a bit signal for selecting a digital grey scale signal, numeral 423 designates an input terminal of a synchronizing signal for horizontal scanning and numeral 424 designates an input terminal for a synchronizing signal for vertical scanning. Naturally, when oscillating circuits forming the analog signals, bit signals, synchronizing signals are also integrated on the substrate, the input terminals are not needed.

(Embodiment 5)

In this embodiment, an explanation will be given of an example in the case of constituting a semiconductor device (semiconductor circuit) of a microprocessor or the like by utilizing the fabrication steps of CMOS circuit described in Embodiment 1. Further, this embodiment is an example of a semiconductor circuit and the circuit constitution is not limited to this embodiment.

Figure 5:
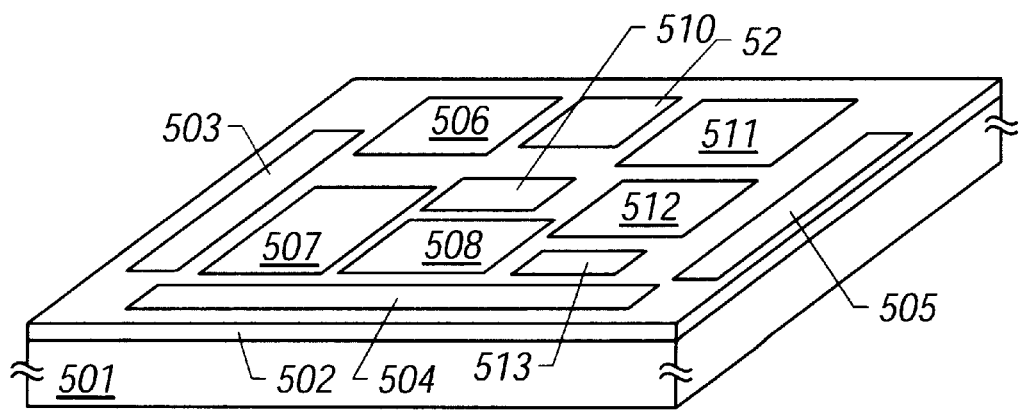
FIG. 5 is a view for explaining an example of a semiconductor circuit.

An example of a microprocessor is shown by a semiconductor circuit illustrated in FIG. 5. An insulating film 502 is formed on a ceramic substrate 501 and the substrate and elements are insulated from each other. Further, on the insulating film 502, I/O ports 503 through 505, CPU 506, a cash memory 507, a cash address array 508, a multiplier 509, a circuit 510 including realtime clock, serial interface, timer and the like, a clock controlling circuit 511, a cash controller 512 and a bus controller 513, are formed.

Further, other than the circuit constitution illustrated by FIG. 5, an LCD (Liquid Crystal Display) driver circuit, a high frequency circuit for portable device and the like can also be constituted. That is, by using TFT as described in Embodiment 1 according to the present invention, conventional IC chip or LSI chip can be fabricated by the above-described TFT.

(Embodiment 6)

According to the example, an explanation will be given of an example in the case where a CMOS circuit having a constitution different from that of Embodiment 1 is constituted in reference to FIGS. 6A and 6B. Further, the basic portion of FIGS. 6A and 6B is provided with a structure totally the same as that of the CMOS circuit explained in Embodiment 1 and therefore, notations the same as those in Embodiment 1 are pertinently used.

Figure 6A:
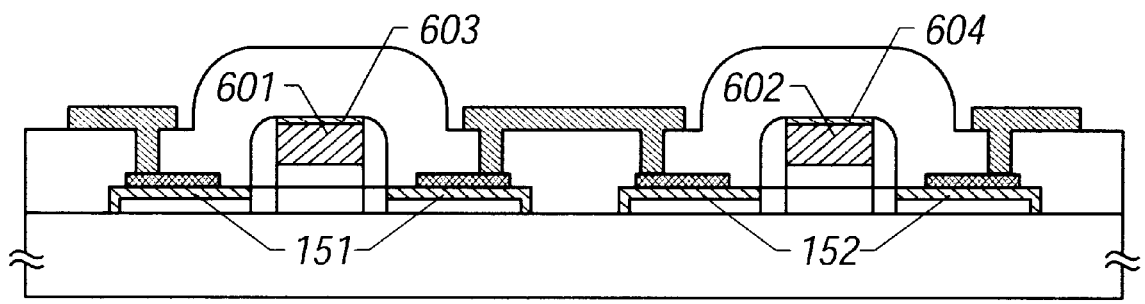
FIGS. 6A and 6B are views for explaining the structure of a CMOS circuit.

First, FIG. 6A shows an example of constituting a CMOS circuit by a silicon gate type TFT utilizing a silicon thin film (polysilicon film) provided with a certain conductivity as gate electrodes 601 and 602 in the CMOS circuit shown by Embodiment 1. Further, a dual gate type TFT where the conductivity of the gate electrode differs with an N-channel type TFT and a P-channel type TFT (N-type or P-type) can be constituted.

With such a silicon gate structure, simultaneously with formation of the films of titanium silicide 148 and 149, films of titanium silicide 603 and 604 are formed also at the upper portions of the gate electrodes 601 and 602. Therefore, the ohmic contact between the gate electrode and connection wirings for connecting to the gate electrode can be improved further excellently.

Figure 6B:
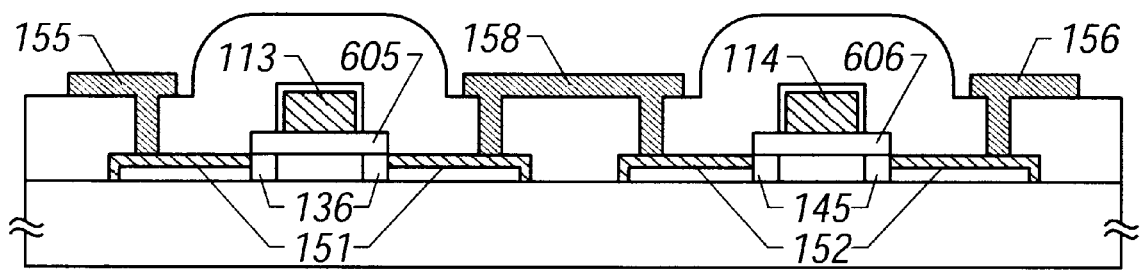

Further, FIG. 6B shows an example in the case where the side walls 130 and 131 and the land-like pattern 151 and 152 comprising titanium are not formed in the CMOS circuit described in Embodiment 2. According to the constitution, the lengths of the low concentration impurity regions 136 and 145 are determined by widths of end portions of the gate insulating films 605 and 606 (portions extended outside of the gate electrodes 113 and 114). Further, according to the structure, the films of titanium silicide 151 and 152 are brought into direct contact with wirings 155, 156 and 158.

According to the structure shown by FIG. 6B, by simplifying the steps of forming the side walls 130 and 131 and the land-like patterns 151 and 152, promotion of the throughput, promotion of the yield and reduction in the fabrication cost can be expected.

Further, although according to Embodiment 1 and Embodiment 6, an explanation has been given of an example of a top gate type TFT such as a planar type TFT, a bottom gate type TFT such as an inverse stagger TFT can also be used. In that case, devise such as using a material having high heat resistance for the gate electrode is needed.

(Embodiment 7)

The present invention is applicable to various electrooptical devices. For example, when a liquid crystal is interposed between the active matrix substrate shown by Embodiment 1 and an opposed substrate, an active matrix type liquid crystal display device is constituted. In this case, when the pixel electrode is formed by a light transmitting material, a transmitting type liquid crystal display device is formed whereas when it is formed by a light reflecting material, a light reflecting type liquid crystal display device is formed.

Further, by more or less modifying the structure of the active matrix substrate, an active matrix type EL (Electroluminescence) display device or an active matrix type EC display device or the like can easily be fabricated.

(Embodiment 8)

According to the embodiment, an explanation will be given of various electronic devices as examples of semiconductor devices to which the present invention is applicable in reference to FIGS. 7A through 7E. As semiconductor devices using the present invention, a (digital) video camera, a (digital) still camera, a head mount display, a car navigation system, a personal computer, portable information terminals (mobile computer, portable telephone and the like) and so on are pointed out. Further, the present invention is applicable also to a portable information terminal mounted with PHS (Personal Handyphone System) that is recently spotlighted.

FIG. 7A shows a mobile computer which is constituted by a main body 2001, a camera unit 2002, an image receiving unit 2003, an operation switch 2004 and a display unit 2005. The present invention is applicable to the display device 2005 or internal circuits.

FIG. 7B shows a head mount display which is constituted by a main body 2101, a display device 2102 and a band unit 2103. The present invention is applicable to the display device 2102.

FIG. 7C shows a car navigation system which is constituted by a main body 2201, a display device 2202, operation switches 2203 and an antenna 2204. The present invention is applicable to the display device 2202 or internal circuits.

FIG. 7D shows a portable telephone which is constituted by a main body 2301, a voice outputting unit 2302, a voice inputting unit 2303, a display device 2304, operation switches 2305 and an antenna 2306. The present invention is applicable to the display device 2304 or a high frequency circuit for communication and so on.

Figure 7E:
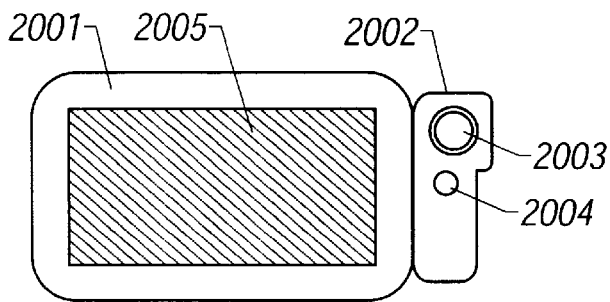
Figure 7E:
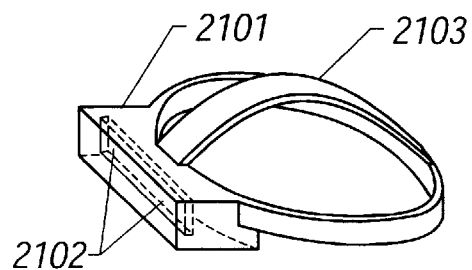
Figure 7E:
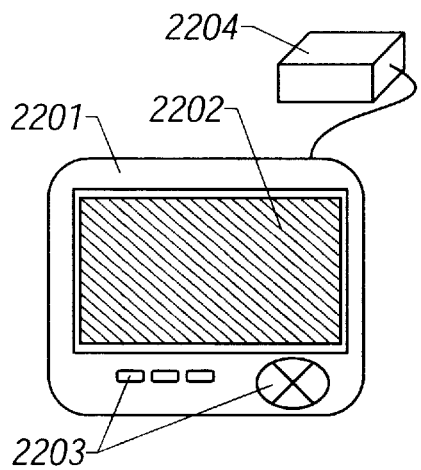
Figure 7E:
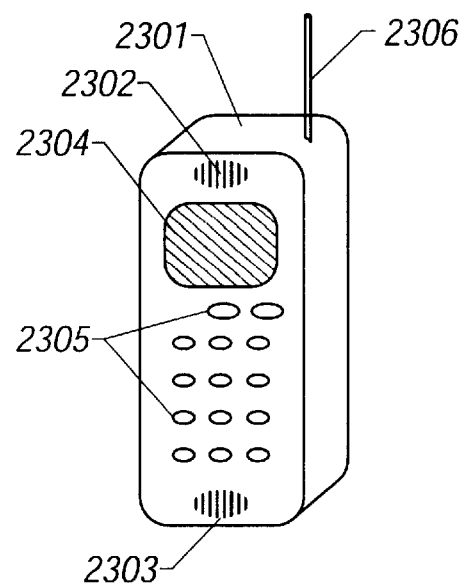
Figure 7E:
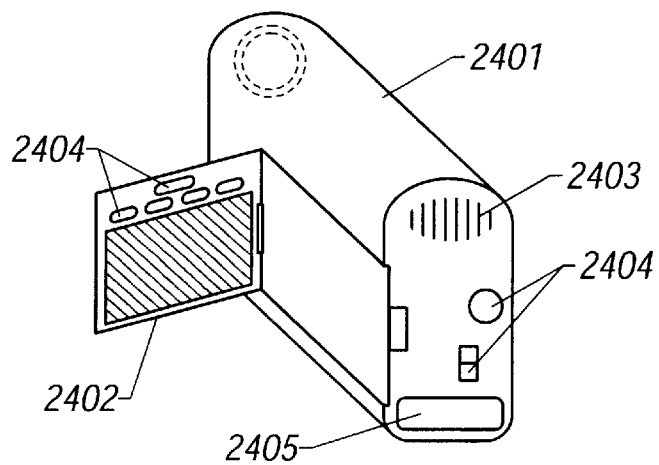

FIG. 7E shows a video camera which is constituted by a main body 2401, a display device 2402, a voice inputting unit 2403, operation switches 2404, a battery 2405 and an image receiving unit 2406. The present invention is applicable to the display device 2402.

As described above, the range of applying the present invention is extremely wide and the present invention is applicable to display media of all the fields. Further, other than these, the present invention covers all the usages so far as the usages are products necessitating semiconductor circuits such as IC or LSI.

According to the present invention disclosed in the specification, TFT having high function equivalent to or superior to IGFET fabricated on single crystal silicon can be realized. Further, even when the channel length is 1 $\mu$m or smaller, extremely high withstand voltage characteristic is achieved even with such a high characteristic.

A semiconductor circuit or an electrooptical device constituted by the above-described TFT and an electronic device having these, are provided with extremely high function and are very excellent in view of functional performance, portability and reliability.

What is claimed is:

1. A semiconductor thin film comprising:

at least two crystals;

grain boundaries among the crystals; and wherein a rate of incommensurate bonds in respect of all of bonds at the grain boundaries is equal to or smaller than 5%.

2. A film according to claim 1, wherein a major component element constituting the crystal is silicon.

3. A semiconductor thin film comprising:

at least two crystals;

grain boundaries among the crystals; and wherein a number of incommensurate bonds included in 100 of bonds is equal to or smaller than 5 at least in one arbitrary region of the grain boundaries.

4. A film according to claim 3, wherein a major component element constituting the crystal is silicon.

5. A semiconductor thin film comprising:

at least two crystals;

grain boundaries among the crystals; and wherein a number of incommensurate bonds included in 50 of bonds is null at least in one arbitrary region of the grain boundaries.

6. A film according to claim 5, wherein a major component element constituting the crystal is silicon.

7. A semiconductor thin film comprising:

at least two crystals;

grain boundaries among the crystals; and an angle made by a lattice striation observed in one arbitrary crystal of the at least two crystals and a lattice striation observed in other crystal contiguous to the one arbitrary crystal falls in a range of 60 through 80°.

8. A film according to claim 7, wherein a major component element constituting the crystal is silicon.

9. A semiconductor device which is an insulated gate type semiconductor device having at least an activation layer formed on a substrate having an insulating surface, a gate insulating film and a gate electrode:

wherein a semiconductor thin film constituting the activation layer comprises at least two crystals and grain boundaries among the crystals and a rate of incommensurate bonds in respect of all of bonds in the grain boundaries is equal to or smaller than 5%.

10. A device according to claim 9, wherein a major component element constituting the crystal is silicon.

11. A semiconductor device which is an insulated gate type semiconductor device comprising at least an activation layer formed on a substrate having an insulating surface, a gate insulating film and a gate electrode:

wherein a semiconductor thin film constituting the activation layer comprises at least two crystals and grain boundaries among the crystals and a number of incommensurate bonds included in 100 of bonds is equal to or smaller than 5 at least in one arbitrary region of the grain boundaries.

12. A device according to claim 11, wherein a major component element constituting the crystal is silicon.

13. A semiconductor device which is an insulated gate type semiconductor device comprising at least an activation layer formed on a substrate having an insulating surface, a gate insulating film and a gate electrode:

wherein a semiconductor thin film constituting the activation layer comprises at least two crystals and grain boundaries among the crystals and a number of incommensurate bonds included in 50 of bonds is null at least in one arbitrary region of the grain boundaries.

14. A device according to claim 13, wherein a major component element constituting the crystal is silicon.

15. A semiconductor device which is an insulated gate type semiconductor device comprising at least an activation layer formed on a substrate having an insulating surface, a gate insulating film and a gate electrode:

wherein a semiconductor thin film constituting the activation layer comprises at least two crystals and grain boundaries among the crystals and an angle made by a lattice striation observed in one arbitrary crystal of the at least two crystals and a lattice striation observed in other crystals contiguous to the one arbitrary crystal falls in a range of 60 through 80°.

16. A device according to claim 15, wherein a major component element constituting the crystal is silicon.

* * * * *